US012622105B2

(12) United States Patent
Noh et al.

(10) Patent No.: US 12,622,105 B2
(45) Date of Patent: *May 5, 2026

(54) DISPLAY DEVICE

(71) Applicant: Samsung Display Co., LTD., Yongin-si (KR)

(72) Inventors: Jung Hun Noh, Yongin-si (KR); Yi Joon Ahn, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 806 days.

This patent is subject to a terminal disclaimer.

(21) Appl. No.: 17/910,323

(22) PCT Filed: Jun. 25, 2020

(86) PCT No.: PCT/KR2020/008275

§ 371 (c)(1),
(2) Date: Feb. 27, 2023

(87) PCT Pub. No.: WO2021/182681

PCT Pub. Date: Sep. 16, 2021

(65) Prior Publication Data

US 2023/0187582 A1 Jun. 15, 2023

(30) Foreign Application Priority Data

Mar. 9, 2020 (KR) ........................ 10-2020-0029012

(51) Int. Cl.
*H01L 25/075* (2006.01)
*H10H 20/831* (2025.01)
*H10H 20/857* (2025.01)

(52) U.S. Cl.
CPC ..... *H10H 20/8312* (2025.01); *H01L 25/0753* (2013.01); *H10H 20/857* (2025.01)

(58) Field of Classification Search
CPC .............. H10H 20/8312; H10H 20/857; H01L 25/0753
See application file for complete search history.

(56) References Cited

U.S. PATENT DOCUMENTS 6,091,194 A * 7/2000 Swirbel .............. H10K 59/1275
345/206
6,201,346 B1 * 3/2001 Kusaka ................ H10K 59/179
313/506

(Continued)

FOREIGN PATENT DOCUMENTS

JP        4145301        9/2008
KR   10-2006-0003244   1/2006

(Continued)

OTHER PUBLICATIONS

International Search Report, with English translation, corresponding to International Application No. PCT/KR2020/008275 dated Dec. 4, 2020.

(Continued)

*Primary Examiner* — Eugene Lee
(74) *Attorney, Agent, or Firm* — Lerner David LLP

(57) ABSTRACT

A display device comprises a base substrate which is a base substrate having a display area and a non-display area positioned around the display area defined therein, and includes a substrate connection electrode penetrating the base substrate in the thickness direction, an etching stopper which is disposed on a first surface of the base substrate and that covers the substrate connection electrode, and a first pad disposed on a second surface opposite to the first surface of the base substrate and disposed overlapping a substrate through hole, wherein the substrate connection electrode is disposed in the display area, the substrate connection electrode is electrically connected to the etching stopper and the first pad, the etching stopper is electrically connected to the (Continued)

first pad through the substrate connection electrode, and the etching stopper includes a conductive material.

19 Claims, 37 Drawing Sheets

(56)                     References Cited

U.S. PATENT DOCUMENTS

| 6,617,177 | B1 * | 9/2003 | Winer | G02F 1/1341 |
| | | | | 438/18 |
| 7,256,483 | B2 * | 8/2007 | Epler | H10H 20/825 |
| | | | | 257/676 |
| 7,417,867 | B1 | 8/2008 | Matsuda et al. | |
| 7,718,456 | B2 * | 5/2010 | Maeda | H10H 20/8506 |
| | | | | 257/98 |
| 8,525,216 | B2 * | 9/2013 | Chen | H05K 1/113 |
| | | | | 257/E33.057 |
| 8,546,838 | B2 * | 10/2013 | Kim | H01L 23/62 |
| | | | | 257/98 |
| 8,692,285 | B2 * | 4/2014 | Nagai | F21K 9/00 |
| | | | | 257/E33.059 |
| 8,803,172 | B2 | 8/2014 | Kim et al. | |
| 9,219,196 | B2 * | 12/2015 | Seo | H10H 20/821 |
| 10,217,416 | B2 * | 2/2019 | Lee | H10K 59/1213 |
| 10,333,042 | B1 | 6/2019 | Liu et al. | |
| 11,756,967 | B2 * | 9/2023 | Yeon | H01L 25/167 |
| | | | | 257/88 |
| 2012/0037935 | A1 * | 2/2012 | Yang | H10F 77/50 |
| | | | | 257/E33.056 |
| 2012/0181568 | A1 * | 7/2012 | Hsia | H10H 20/8506 |
| | | | | 257/E33.056 |
| 2012/0286240 | A1 * | 11/2012 | Yu | H01L 24/24 |
| | | | | 438/28 |
| 2014/0049522 | A1 | 2/2014 | Mathew et al. | |
| 2014/0063393 | A1 | 3/2014 | Zhong et al. | |
| 2014/0209930 | A1 * | 7/2014 | Weng | H10H 20/857 |
| | | | | 438/26 |
| 2015/0348906 | A1 * | 12/2015 | Park | H10H 20/857 |
| | | | | 257/774 |
| 2016/0118562 | A1 * | 4/2016 | Yu | H10H 20/825 |
| | | | | 257/13 |
| 2017/0012095 | A1 | 1/2017 | Zhong et al. | |
| 2017/0140701 | A1 * | 5/2017 | Ogonowsky | H10H 20/812 |
| 2017/0148702 | A1 | 5/2017 | Funayama et al. | |
| 2019/0371707 | A1 * | 12/2019 | Yueh | H01L 23/53228 |
| 2020/0227603 | A1 * | 7/2020 | Pun | H10H 20/8506 |

FOREIGN PATENT DOCUMENTS

| KR | 10-2007-0038751 | 4/2007 |
| KR | 10-2010-0096545 | 9/2010 |
| KR | 10-2013-0125032 | 11/2013 |
| KR | 10-2013-0142750 | 12/2013 |
| KR | 10-2014-0029196 | 3/2014 |
| KR | 10-2014-0072422 | 6/2014 |
| KR | 10-2016-0141176 | 12/2016 |
| KR | 10-2018-0041301 | 4/2018 |
| KR | 10-2019-0003198 | 1/2019 |
| KR | 10-2019-0035986 | 4/2019 |

OTHER PUBLICATIONS

Written Opinion, with English translation, corresponding to International Application No. PCT/KR2020/008275 dated Dec. 4, 2020.

* cited by examiner

DA

NDA

SEAL

I

I'

1

DR2

DR1

DT : DT_ACT, DT_G, DT_SD1, DT_SD2
ST : ST_ACT, ST_G, ST_SD1, ST_SD2

DISPLAY DEVICE

CROSS-REFERENCE TO RELATED APPLICATION(S)

This application is a national entry of International Application No. PCT/KR2020/008275, filed on Jun. 25, 2020, which claims under 35 U. S.C. § 119(a) and 365(b) priority to and benefits of Korean Patent Application No. 10-2020-0029012, filed on Mar. 9, 2020 in the Korean Intellectual Property Office, the entire contents of which are herein incorporated by reference.

BACKGROUND

1. Technical Field

The disclosure relates to a display device.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and may include a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

SUMMARY

Aspects of the disclosure provide a display device in which a driving circuit unit may be disposed on a rear surface of a base substrate.

It should be noted that aspects of the disclosure are not limited thereto and other aspects, which may not be mentioned herein, will be apparent to those of ordinary skill in the art from the following description.

According to an embodiment of the disclosure, a display device may include a base substrate in which a display area and a non-display area positioned around the display area may be defined and which includes a substrate connection electrode passing through the base substrate in a thickness direction thereof, an etching stopper disposed on a first surface of the base substrate and that covers a substrate through-hole, and a first pad disposed on a second surface opposite to the first surface of the base substrate and disposed to overlap the substrate through-hole. The substrate connection electrode may be disposed in the display area and electrically connected to the etching stopper and the first pad, and the etching stopper may be electrically connected to the first pad through the substrate connection electrode and includes a conductive material.

The display device may further include a buffer layer disposed on the etching stopper, an active material layer disposed on the buffer layer, and a light blocking layer disposed to overlap the active material layer. The light blocking layer may be disposed to be coplanar with the etching stopper and spaced apart from the etching stopper.

The display device may further include a first gate insulating layer disposed on the active material layer, a data line disposed on the first gate insulating layer, wherein the data line may be electrically connected to the etching stopper through a data connection electrode passing through the first gate insulating layer and the buffer layer in a thickness direction thereof, and a connection line disposed on the second surface of the base substrate, wherein the connection line may be electrically connected to the first pad.

The display device may further include a chip-on-film which may be disposed on the second surface of the base substrate and on which a driving chip may be mounted, and a second pad disposed on the second surface of the base substrate. The second pad may be electrically connected to the connection line, and the chip-on-film may be electrically connected to the second pad.

The display device may further include a driving chip disposed on the second surface of the base substrate, and a second pad disposed on the second surface of the base substrate. The second pad may be connected to the connection line, and the driving chip may be disposed to overlap the second pad and connected to the second pad.

The first surface of the base substrate may be in contact with the etching stopper, and the substrate connection electrode may be surrounded by an extension of the second surface of the base substrate, an extension of the first surface of the base substrate, and side surfaces of the base substrate.

A width of the substrate connection electrode may decrease in a direction from the extension of the second surface of the base substrate toward the extension of the first surface of the base substrate.

A slope of a side surface of the substrate connection electrode in contact with the side surface of the base substrate may gradually increase in a direction from the extension of the second surface of the base substrate toward the extension of the first surface of the base substrate.

A width of the substrate connection electrode may be constant from the extension of the second surface of the base substrate to the extension of the first surface of the base substrate.

A roughness of a portion of one surface of the etching stopper in contact with the substrate connection electrode may be higher than a roughness of a portion of the one surface of the etching stopper that may not be in contact with the substrate connection electrode.

An etching residue may be further disposed on a surface of the etching stopper in contact with the substrate connection electrode, and the etching residue may include the same material as the base substrate.

The display area may include a plurality of pixels, each of the pixels may include an emission area and a non-emission area positioned around the emission area, an external bank disposed on the data line may be disposed in the non-emission area, a light-emitting element may be disposed in the emission area, and the emission area may be surrounded by the external bank in a plan view.

The substrate connection electrode may be disposed to overlap the emission area.

The substrate connection electrode may be disposed to overlap the external bank of the non-emission area.

The display device may further include a first gate insulating layer disposed on the active material layer, a gate connection electrode disposed on the first gate insulating layer, a first protective layer disposed on the gate connection electrode, and a data line disposed on the first protective layer. The data line may be electrically connected to the gate connection electrode through a data connection electrode passing through the first protective layer, and the gate connection electrode may be electrically connected to the etching stopper through a gate connection electrode passing through the first gate insulating layer and the buffer layer.

According to an embodiment of the disclosure, a display device may include a base substrate in which a display area and a non-display area positioned around the display area may be defined and which includes a substrate through-hole passing through the base substrate in a thickness direction thereof, a buffer layer which may be a buffer layer disposed on a first surface of the base substrate and includes a buffer through-hole disposed to overlap the substrate through-hole and passing through the buffer layer in a thickness direction thereof, a data line disposed on the buffer layer, a substrate connection electrode that fills the substrate through-hole and the buffer through-hole, wherein the substrate connection electrode may be disposed in the display area and electrically connected to the data line, and a first pad disposed on a second surface opposite to the first surface of the base substrate and disposed to overlap the substrate through-hole, wherein the first pad may be electrically connected to the substrate through-hole.

The first surface of the base substrate may be in contact with the buffer layer, the substrate through-hole may be surrounded by an extension of the second surface of the base substrate, an extension of the first surface of the base substrate, and side surfaces of the base substrate, the buffer layer may include a first surface in contact with the first surface of the base substrate and a second surface opposite to the first surface of the buffer layer, the buffer through-hole may be surrounded by an extension of the first surface of the buffer layer, an extension on the second surface of the buffer layer, and side surfaces of the buffer layer, and an average slope of the side surface of the buffer layer may be greater than an average slope of the side surface of the base substrate.

The display device may further include a first gate insulating layer disposed directly on the second surface of the buffer layer. A roughness of a surface of the first gate insulating layer in contact with the substrate connection electrode may be higher than a roughness of a surface of the first gate insulating layer that may not be in contact with the substrate connection electrode.

The display device may further include a first gate insulating layer disposed directly on the second surface of the buffer layer. An etching residue may be further disposed on a surface of the first gate insulating layer in contact with the substrate connection electrode and includes a same material as a material of the buffer layer.

The buffer through-hole may be disposed to partially overlap a surface of the base substrate in a thickness direction thereof.

The details of other embodiments are included in the detailed description and the accompanying drawings.

In a display device according to an embodiment, a driving circuit unit may be disposed on a rear surface of a base substrate, thereby reducing a dead space.

It should be noted that aspects of the disclosure are not limited to the above, and other aspects of the disclosure will be apparent to those skilled in the art from the following descriptions.

The effects according to the embodiments are not limited by the contents given as examples above, and additional various effects are included in this disclosure.

BRIEF DESCRIPTION OF DRAWINGS

FIG. 7 shows schematic cross-sectional views taken along lines II-II' and III-III' of FIGS. 3 and 6.

FIGS. 9 to 14 are schematic cross-sectional views of process operations of a method of manufacturing a display device according to an embodiment.

FIG. 27 is a schematic cross-sectional view of a display device according to yet another embodiment.

FIG. 28 is a schematic cross-sectional view of a display device according to yet another embodiment.

FIGS. 30 to 33 are schematic cross-sectional views of process operations of a method of manufacturing a display device according to another embodiment.

DETAILED DESCRIPTION OF THE EMBODIMENTS

Figure 1:
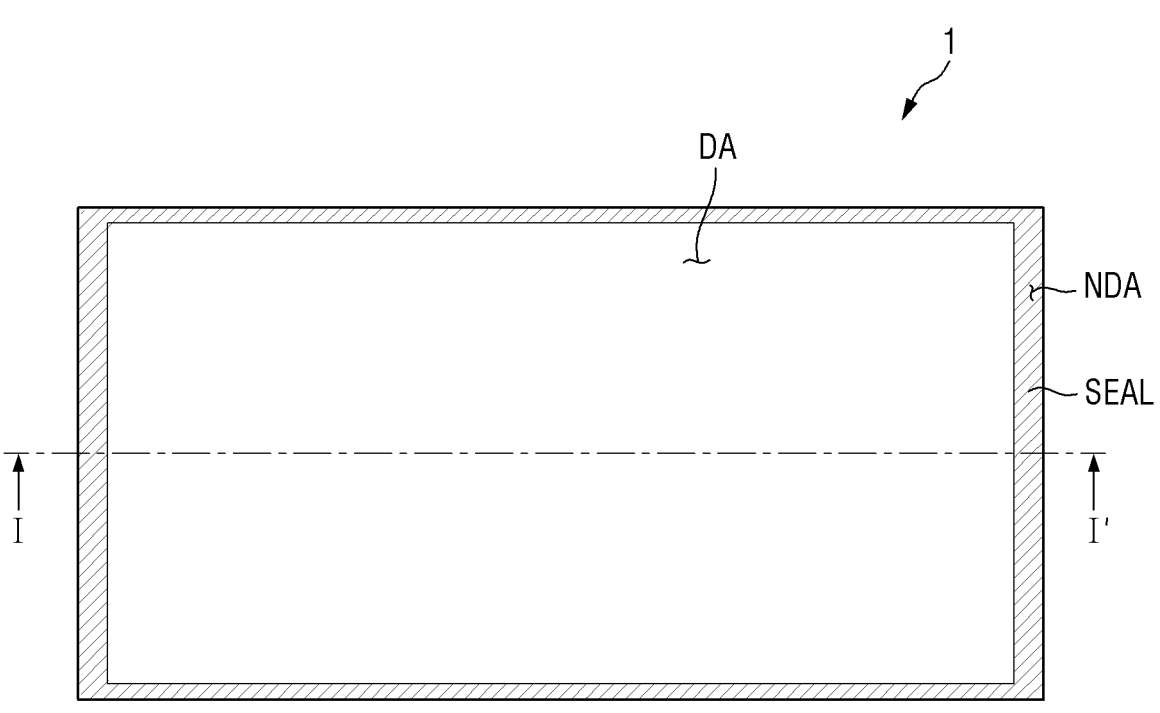
FIG. 1 is a schematic plan view of a display device according to an embodiment.
Figure 1:
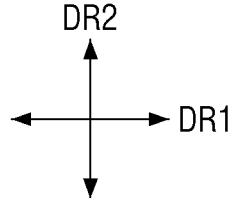

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

It will be understood that the terms "connected to" or "coupled to" may include a physical or electrical connection or coupling.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
FIG. 2 is a schematic cross-sectional view taken along line I-I' of FIG. 1.
Figure 2:

FIG. 1 is a schematic plan view of a display device according to an embodiment. FIG. 2 is a schematic cross-sectional view taken along line I-I' of FIG. 1.

Referring to FIGS. 1 and 2, a display device 1 may be applied to various electronic devices including small and medium-sized electronic devices such as a tablet personal computer (PC), smartphone, a vehicle navigation unit, a camera, a center information display (CID) provided in a vehicle, a wrist watch-type electronic device, a personal digital assistant (PDA), a portable multimedia player (PMP), and a game console and large-sized electronic devices such as a television, an external billboard, a monitor, a PC, and a laptop computer. However, the various electronic devices are merely provided as example embodiments, and the display device 1 may be applied to other electronic devices without departing from the spirit of the disclosure.

In some embodiments, the display device 1 may have a rectangular shape in a plan view. The display device 1 may include two first sides extending in a first direction DR1 and two second sides extending in a second direction DR2 intersecting the first direction DR1. A corner at which the first side and the second side of the display device 1 meet each other may have a right angle but is not limited thereto. The corner may form a curved surface. In some embodiments, the first side may be longer than the second side but is not limited thereto. A planar shape of the display device 1 is not limited to the illustrated one, and a circular shape or other shapes may be applied.

The display device 1 may include a display area DA in which an image may be displayed and a non-display area NDA in which an image may not be displayed. In some embodiments, the non-display area NDA may be positioned around the display area DA and may surround the display area DA.

In an embodiment, the display device 1 may include a first display substrate 10 and a second display substrate 20 opposite to the first display substrate 10 and may further include a sealing member SEAL which couples the first display substrate 10 and the second display substrate 20 and a filler FM which fills a space between the first display substrate 10 and the second display substrate 20. The sealing member SEAL may be disposed in the non-display area NDA and may be disposed to not overlap the display area DA.

The first display substrate 10 may include elements and circuits for displaying an image, for example, pixel circuits such as a switching element, external banks for defining an emission area and a non-emission area to be described below in the display area DA, and self-light-emitting elements. In an embodiment, a self-light-emitting element may include at least one of an organic light-emitting diode (LED), a quantum dot LED, an inorganic-based micro LED (for example, a micro LED), and an inorganic-based nano LED (for example, a nano LED).

The second display substrate 20 may be positioned above the first display substrate 10 and may be opposite to the first display substrate 10. The second display substrate 20 may include a color conversion pattern for converting a color of incident light. In some embodiments, the color conversion pattern may include at least one of a color filter and a color control layer.

The sealing member SEAL may be positioned between the first display substrate 10 and the second display substrate 20 in the non-display area NDA. The sealing member SEAL may be disposed along edges of the first display substrate 10 and the second display substrate 20 in the non-display area NDA to surround the display area DA in a plan view. The first display substrate 10 and the second display substrate 20 may be coupled to each other through the sealing member SEAL. In some embodiments, the sealing member SEAL may be made of an organic material. As an example, the sealing member SEAL may be made of an epoxy-based resin, but the disclosure is not limited thereto.

The filler FM may be positioned in the space, which may be surrounded by the sealing member SEAL, between the first display substrate 10 and the second display substrate 20. The filler FM may fill the space between the first display substrate 10 and the second display substrate 20. The filler FM may be made of a material capable of transmitting light. In some embodiments, the filler FM may be made of an organic material. As an example, the filler FM may be made of a silicon-based organic material, an epoxy-based organic material, or the like, but the disclosure is not limited thereto. In some cases, the filler FM may be omitted.

Figure 3:
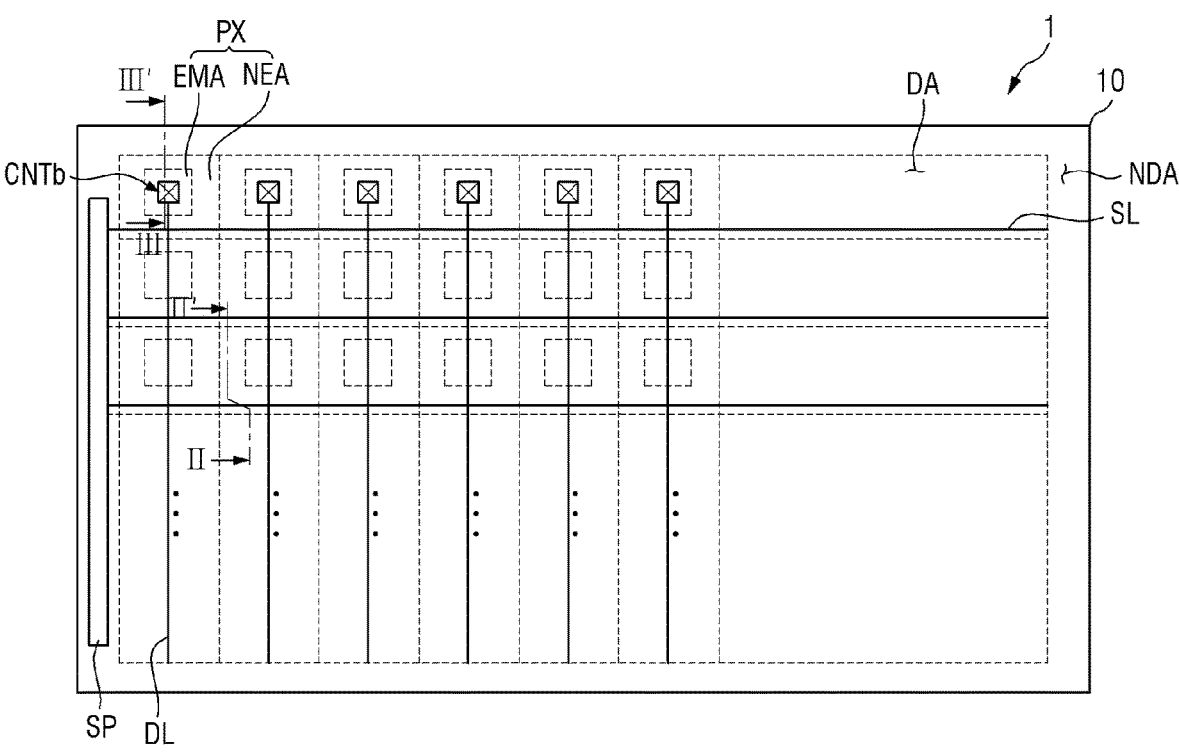
FIG. 3 is a schematic plan view of the display device viewed from above according to an embodiment.
Figure 3:
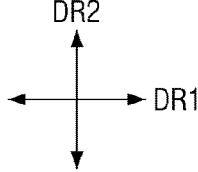

FIG. 3 is a schematic plan view of the display device viewed from above according to an embodiment.

Referring to FIG. 3, pixels PX may be disposed in the display area DA. The pixels PX may be arranged in a matrix form in the first direction DR1 and the second direction DR2. The pixels PX arranged in the first direction DR1 may form pixel rows. Multiple pixel rows may be formed. The pixel rows may be arranged in the second direction DR2. Similarly, the pixels PX arranged in the second direction DR2 may form pixel columns. Multiple pixel columns may be formed. The pixel columns may be arranged in the first direction DR1.

Scan drivers SP may be disposed in the non-display area NDA. The scan driver SP may include at least one thin film transistor. The scan driver SP may be connected to scan lines SL. Multiple scan drivers SP may be provided. The scan driver SP may be positioned in each of the non-display area NDA at a side (or a right side) of the display area DA in the first direction DR1 and the non-display area NDA at another side (or a left side) of the display area DA in the first direction DR1. In some embodiments, one scan driver SP may be provided. One scan driver SP may be disposed in the non-display area NDA at a side or another side of the display area DA in the first direction DR1. The scan line SL may extend along the pixel row. Multiple scan lines SL may be provided. The scan lines SL may be arranged in the second direction DR2. Each of the scan lines SL arranged in the second direction DR2 may be connected to any one of the pixel rows.

Data lines DL may extend along the pixel columns. Multiple data lines DL may be provided. The data lines DL may be arranged in the first direction DR1. Each of the data lines DL arranged in the first direction DR1 may be connected to any one of the pixel columns.

The data lines DL may be connected to substrate connection electrodes CNTb. Multiple substrate connection electrodes CNTb may be provided. Each substrate connection electrode CNTb may correspond to each data line DL. The substrate connection electrodes CNTb are illustrated in FIG. 3 as being arranged in the first direction DR1, but the arrangement of the substrate connection electrodes CNTb is not limited thereto. As will be described below, the data line DL may be connected to a first pad PAD1 (see FIGS. 6 and 7) through a data connection electrode CNTa (see FIG. 7), an etching stopper ES (see FIG. 7), and the substrate connection electrode CNTb.

Each pixel PX may include an emission area EMA and a non-emission area NEA positioned around the emission area EMA. As described above, the non-emission area NEA and the emission area EMA may be distinguished from each other through an external bank 45 (see FIG. 7) and a light-emitting element 30 (see FIG. 7). The external bank 45 may be disposed in the non-emission area NEA, and the light-emitting elements 30 may be disposed in the emission area EMA. The external bank 45 may not be disposed in the emission area EMA, and the light-emitting element 30 may not be disposed in the non-emission area NEA. The substrate connection electrode CNTb and the data connection electrode CNTa may be disposed in the emission area EMA.

Figure 4:
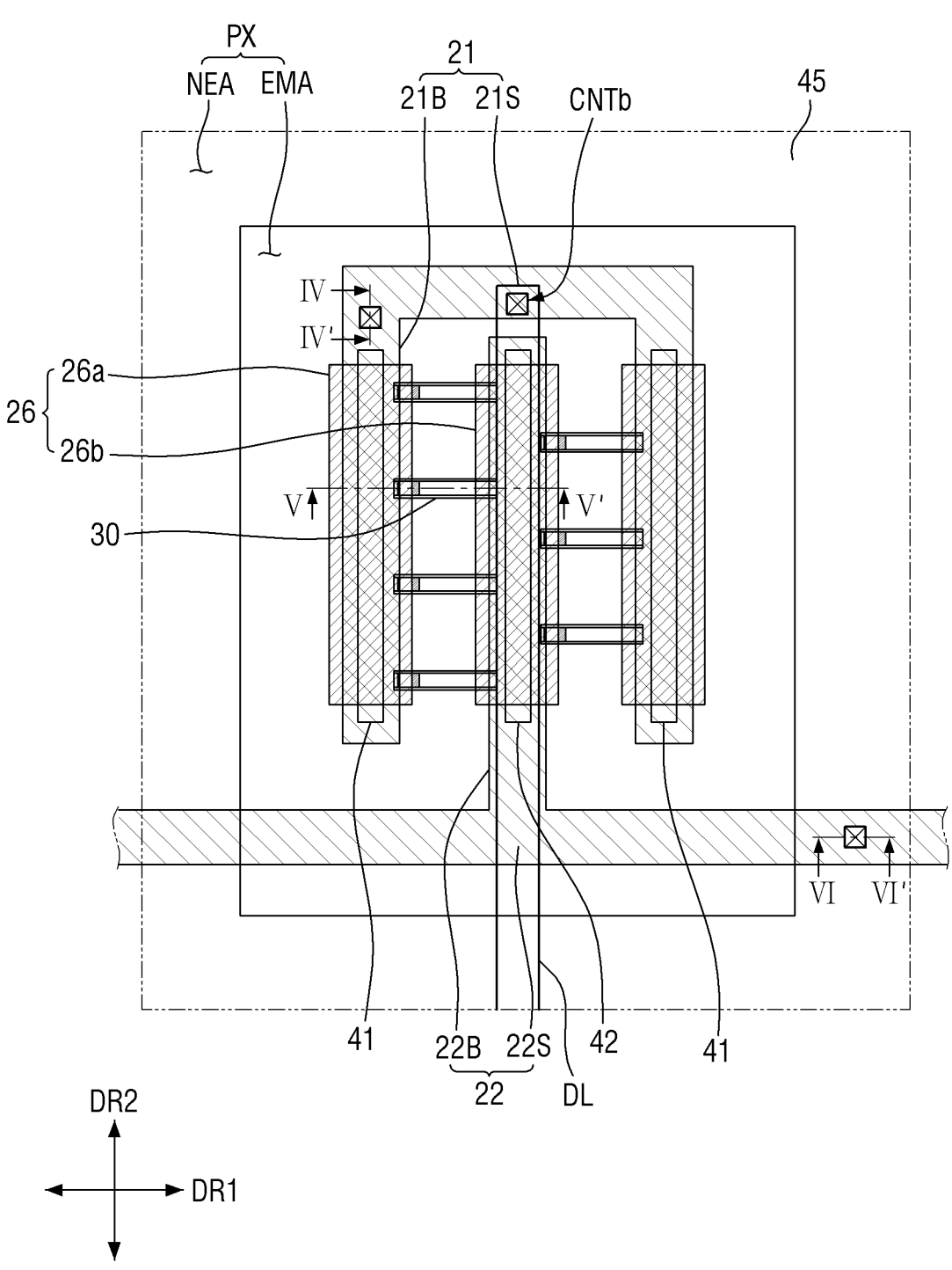
FIG. 4 is an enlarged schematic plan view of a pixel of FIG. 3.
Figure 5:
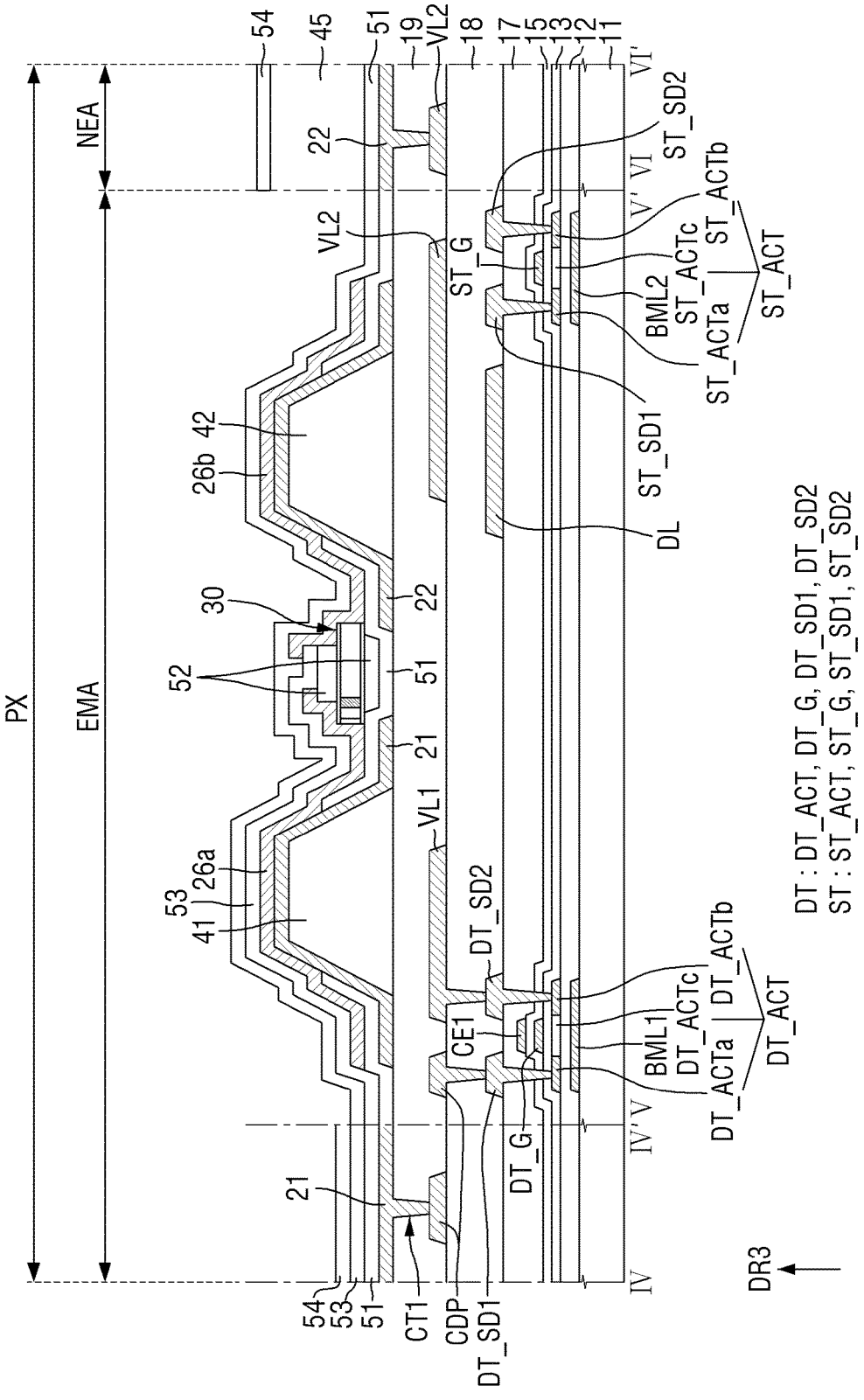
FIG. 5 shows schematic cross-sectional views taken along lines IV-IV', V-V', and VI-VI' of FIG. 4.

FIG. 4 is an enlarged schematic plan view of the pixel of FIG. 3. FIG. 5 shows cross-sectional views taken along lines IV-IV', V-V', and VI-VI' of FIG. 4.

Referring to FIG. 4, any one of the pixels PX may emit light having a first color, another one of the of pixels PX may emit light having a second color, and still another one of the pixels PX may emit light having a third color. The first color may be red, the second color may be green, and the third color may be blue. However, the disclosure is not limited thereto, and all the pixels PX may emit light having the same color.

The pixels PX of the display device 1 may include an area defined as the emission area EMA. The emission area EMA may be defined as an area in which the light-emitting element 30 included in the display device 1 may be disposed to emit light having a specific wavelength. The light-emitting element 30 may include an active layer, and the active layer may emit light having a specific wavelength without directionality. Light emitted from the active layer of the light-emitting element 30 may be emitted toward both side surfaces of the light-emitting element 30. The emission area EMA may include an area in which the light-emitting element 30 may be disposed and an area which may be adjacent to the light-emitting element 30 and in which light emitted from the light-emitting element 30 may be emitted.

The disclosure is not limited thereto, and the emission area EMA may also include an area in which light emitted from the light-emitting element 30 may be reflected or refracted by other members and emitted. Multiple light-emitting elements 30 may be disposed in each pixel PX, and the area in which the light-emitting elements 30 may be disposed and the area adjacent to the light-emitting elements 30 may be combined to form the emission area EMA.

Although not shown in the drawings, each pixel PX of the display device 1 may include the non-emission area NEA defined as an area excluding the emission area EMA. The non-emission area NEA may be an area in which the light-emitting elements 30 may not be disposed and light emitted from the light-emitting elements 30 may not arrive so that light may not be emitted. The external bank 45 may be disposed in the non-emission area NEA.

Referring to FIG. 5 in conjunction with FIG. 4, the display device 1 may include a first substrate 11 or a first base substrate, and a circuit element layer and a display element layer which may be disposed on the first substrate 11. A semiconductor layer, conductive layers, and insulating layers may be disposed on the first substrate 11 and may constitute the circuit element layer and the display element layer. The conductive layers may include a first gate conductive layer, a second gate conductive layer, a first data conductive layer, and a second data conductive layer which may be disposed under a first planarization layer 19 to constitute the circuit element layer, and electrodes 21 and 22 and contact electrodes 26 which may be disposed on the first planarization layer 19 to constitute the display element layer. The insulating layers may include a buffer layer 12, a first gate insulating layer 13, a first protective layer 15, a first interlayer insulating layer 17, a second interlayer insulating layer 18, the first planarization layer 19, a first insulating layer 51, a second insulating layer 52, a third insulating layer 53, and a fourth insulating layer 54.

Specifically, the first substrate 11 may be an insulating substrate. The first substrate 11 may be made of an insulating material such as glass, quartz, and/or a polymer resin. The first substrate 11 may be a rigid substrate and may also be a flexible substrate which may be bendable, foldable, and/or rollable.

Light blocking layers BML1 and BML2 may be disposed on the first substrate 11. The first substrate 11 may include a surface on which the light blocking layers BML1 and BML2 may be disposed and another surface opposite to the surface of the first substrate 11. The light blocking layers BML1 and BML2 may be disposed directly on the surface of the first substrate 11. The light blocking layers BML1 and BML2 may include a first light blocking layer BML1 and a second light blocking layer BML2. The first light blocking layer BML1 and the second light blocking layer BML2 may at least overlap a first active material layer DT_ACT of a driving transistor DT and a second active material layer ST_ACT of a switching transistor ST, respectively. The light blocking layers BML1 and BML2 may include a material that blocks light, thereby preventing light from being incident on the first and second active material layers DT_ACT and ST_ACT. As an example, the light blocking layers BML1 and BML2 may be made of an opaque metal material that blocks light transmission. However, the disclosure is not limited thereto, and in some cases, the light blocking layers BML1 and BML2 may be omitted.

The buffer layer 12 may be disposed on the entirety of the first substrate 11 on which the light blocking layers BML1 and BML2 may be disposed. The buffer layer 12 may be formed on the first substrate 11 to protect the transistors DT and ST of the pixel PX from moisture permeating through the first substrate 11 that may be vulnerable to moisture permeation. The buffer layer 12 may perform a surface planarization function. The buffer layer 12 may be provided as multiple inorganic layers that may be alternately stacked on each other. For example, the buffer layer 12 may be formed as a multi-layer in which inorganic layers, which include at least one selected from among silicon oxide (SiOx), silicon nitride (SiNx), and silicon oxynitride (SiON), may be alternately stacked on each other.

The semiconductor layer may be disposed on the buffer layer 12. The semiconductor layer may include the first active material layer DT_ACT of the driving transistor DT and the second active material layer ST_ACT of the switching transistor ST. The first active material layer DT_ACT and the second active material layer ST_ACT may be disposed to partially overlap gate electrodes DT_G and ST_G of the first gate conductive layer, which will be described below.

In an embodiment, the semiconductor layer may include polycrystalline silicon, single crystal silicon, an oxide semiconductor, or the like. Polycrystalline silicon may be formed by crystallizing amorphous silicon. In case that the semiconductor layer includes polycrystalline silicon, the first active material layer DT_ACT may include a first doped region DT_ACTa, a second doped region DT_ACTb, and a first channel region DT_ACTc. The first channel region DT_ACTc may be disposed between the first doped region DT_ACTa and the second doped region DT_ACTb. The second active material layer ST_ACT may include a third doped region ST_ACTa, a fourth doped region ST_ACTb, and a second channel region ST_ACTc. The second channel region ST_ACTc may be disposed between the third doped region ST_ACTa and the fourth doped region ST_ACTb. The first doped region DT_ACTa, the second doped region DT_ACTb, the third doped region ST_ACTa, and the fourth doped region ST_ACTb may be regions in which partial regions of the first active material layer DT_ACT and the second active material layer ST_ACT may be doped with impurities.

In another embodiment, the first active material layer DT_ACT and the second active material layer ST_ACT may include an oxide semiconductor. Each of the doped regions of the first active material layer DT_ACT and the second active material layer ST_ACT may be a conductive region. The oxide semiconductor may be an oxide semiconductor containing indium (In). In some embodiments, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc tin oxide (IGZTO), or the like. However, the disclosure is not limited thereto.

The first gate insulating layer 13 may be disposed on the semiconductor layer and the buffer layer 12. The first gate insulating layer 13 may be disposed on the buffer layer 12 and the semiconductor layer. The first gate insulating layer 13 may serve as a gate insulating film of each of the driving transistor DT and the switching transistor ST. The first gate insulating layer 13 may be formed as an inorganic layer made of an inorganic material such as silicon oxide (SiOx), silicon nitride (SiNx), or silicon oxynitride (SiON) or may be formed in a structure in which the inorganic layers may be stacked on each other.

The first gate conductive layer may be disposed on the first gate insulating layer 13. The first gate conductive layer may include a first gate electrode DT_G of the driving transistor DT and a second gate electrode ST_G of the switching transistor ST. The first gate electrode DT_G may be disposed to overlap the first channel region DT_ACTc of the first active material layer DT_ACT in a thickness direction thereof, and the second gate electrode ST_G may be disposed to overlap the second channel region ST_ACTc of the second active material layer ST_ACT in a thickness direction thereof.

The first gate conductive layer may be formed as a single layer or a multi-layer made of at least one selected from among molybdenum (Mo), aluminum (Al), chromium (Cr), gold (Au), titanium (Ti), nickel (Ni), neodymium (Nd), and copper (Cu), or an alloy thereof. However, the disclosure is not limited thereto.

The first protective layer 15 may be disposed on the first gate conductive layer. The first protective layer 15 may be disposed to cover the first gate conductive layer and may perform a function of protecting the first gate conductive layer. The first protective layer 15 may be formed as an inorganic layer made of an inorganic material such as silicon oxide (SiOx), silicon nitride (SiNx), or silicon oxynitride (SiON) or may be formed in a structure in which the inorganic layers may be stacked on each other.

The second gate conductive layer may be disposed on the first protective layer 15. The second gate conductive layer may include a first capacitance electrode CE1 of a storage capacitor disposed such that at least a partial area thereof overlaps the first gate electrode DT_G in a thickness direction thereof. The first capacitance electrode CE1 may overlap the first gate electrode DT_G in the thickness direction with the first protective layer 15 interposed therebetween, and the storage capacitor may be formed therebetween. The second gate conductive layer may be formed as a single layer or a multi-layer made of at least one selected from among molybdenum (Mo), aluminum (Al), chromium (Cr), gold (Au), titanium (Ti), nickel (Ni), neodymium (Nd), and copper (Cu), or an alloy thereof. However, the disclosure is not limited thereto.

The first interlayer insulating layer 17 may be disposed on the second gate conductive layer. The first interlayer insulating layer 17 may serve as an insulating film between the first gate conductive layer and other layers disposed thereon. The first interlayer insulating layer 17 may be formed as an inorganic layer made of an inorganic material such as silicon oxide (SiOx), silicon nitride (SiNx), or silicon oxynitride (SiON) or may be formed in a structure in which the inorganic layers may be stacked on each other.

The first data conductive layer may be disposed on the first interlayer insulating layer 17. The first gate conductive layer may include a first source/drain electrode DT_SD1 and a second source/drain electrode DT_SD2 of the driving transistor DT and a first source/drain electrode ST_SD1 and a second source/drain electrode ST_SD2 of the switching transistor ST.

The first source/drain electrode DT_SD1 and the second source/drain electrode DT_SD2 of the driving transistor DT may be in contact with the first doped region DT_ACTa and the second doped region DT_ACTb of the first active material layer DT_ACT through contact holes passing through the first interlayer insulating layer 17 and the first gate insulating layer 13, respectively. The first source/drain electrode ST_SD1 and the second source/drain electrode ST_SD2 of the switching transistor ST may be in contact with the third doped region ST_ACTa and the fourth doped region ST_ACTb of the second active material layer ST_ACT through contact holes passing through the first interlayer insulating layer 17 and the first gate insulating layer 13, respectively. The first source/drain electrode DT_SD1 of the driving transistor DT and the first source/drain electrode ST_SD1 of the switching transistor ST may be electrically connected to the first light blocking layer BML1 and the second light blocking layer BML2 through other contact holes, respectively. In the first source/drain electrodes DT_SD1 and ST_SD1 and the second source/drain electrodes DT_SD2 and ST_SD2 of the driving transistor DT and the switching transistor ST, any one electrode may be a source electrode, and another electrode may be a drain electrode. However, the disclosure is not limited thereto, in the first source/drain electrodes DT_SD1 and ST_SD1 and the second source/drain electrodes DT_SD2 and ST_SD2, any one electrode may be a drain electrode, and another electrode may be a source electrode.

The first data conductive layer may be formed as a single layer or a multi-layer made of at least one selected from among molybdenum (Mo), aluminum (Al), chromium (Cr), gold (Au), titanium (Ti), nickel (Ni), neodymium (Nd), and copper (Cu), or an alloy thereof. However, the disclosure is not limited thereto.

The second interlayer insulating layer 18 may be disposed on the first data conductive layer. The second interlayer insulating layer 18 may cover the first data conductive layer, may be disposed on the entirety of the first interlayer insulating layer 17, and may perform a function of protecting the first data conductive layer. The second interlayer insulating layer 18 may be formed as an inorganic layer made of an inorganic material such as silicon oxide (SiOx), silicon nitride (SiNx), and/or silicon oxynitride (SiON) or may be formed in a structure in which the inorganic layers may be stacked on each other.

The second data conductive layer may be disposed on the second interlayer insulating layer 18. The second data conductive layer may include a first voltage line VL1, a second voltage line VL2, and a first conductive pattern CDP. A high potential voltage (or a first power voltage) supplied to the driving transistor DT may be applied to the first voltage line VL1, and a low potential voltage (or a second power voltage) supplied to a second electrode 22 may be applied to the second voltage line VL2. An arrangement signal required to arrange the light-emitting elements 30 may be applied to the second voltage line VL2 in a manufacturing process of the display device 1.

The first conductive pattern CDP may be electrically connected to the first source/drain electrode DT_SD1 of the driving transistor DT through a contact hole formed in the second interlayer insulating layer 18. The first conductive pattern CDP may also be in contact with a first electrode 21 to be described below, and the driving transistor DT may transmit the first power voltage applied from the first voltage line VL1 to the first electrode 21 through the first conductive pattern CDP. The second data conductive layer is illustrated in the drawing as including one second voltage line VL2 and one first voltage line VL1, but the disclosure is not limited thereto. The second data conductive layer may include more first voltage lines VL1 and more second voltage lines VL2.

The second data conductive layer may be formed as a single layer or a multi-layer made of at least one selected from among molybdenum (Mo), aluminum (Al), chromium (Cr), gold (Au), titanium (Ti), nickel (Ni), neodymium (Nd), and copper (Cu), or an alloy thereof. However, the disclosure is not limited thereto.

The first planarization layer 19 may be disposed on the second data conductive layer. The first planarization layer 19 may include an organic insulating material, for example, an organic material such as polyimide (PI), and may perform a surface planarization function.

Internal banks 41 and 42, the electrodes 21 and 22, the external bank 45, the contact electrodes 26, and the light-emitting elements 30 may be disposed on the first planarization layer 19. Insulating layers 51, 52, 53, and 54 may be further disposed on the first planarization layer 19.

The internal banks 41 and 42 may be disposed directly on the first planarization layer 19. The internal banks 41 and 42 may include a first internal bank 41 and a second internal bank 42 which may be disposed adjacent to a center of each pixel PX.

The first internal bank 41 and the second internal bank 42 may be disposed apart from and face each other in the first direction DR1. The internal banks 41 and 42 may be disposed apart from and face each other so that an area in which the light-emitting elements 30 may be disposed may be formed therebetween. The first internal bank 41 and the second internal bank 42 may extend in the second direction DR2 and may be disposed at a boundary between the pixels PX to be spaced apart from each other so as to not extend to another adjacent pixel PX in the second direction DR2. Accordingly, the first internal bank 41 and the second internal bank 42 may be disposed for each pixel PX to form a pattern on the entirety of the display device 1. Although only one first internal bank 41 and one second internal bank 42 are illustrated in FIGS. 4 and 5, the disclosure is not limited thereto. More internal banks 41 and 42 may be further disposed according to the number of the electrodes 21 and 22 to be described below.

The first internal bank 41 and the second internal bank 42 may have a structure of which at least a portion protrudes from an upper surface of the first planarization layer 19. The protruding portions of the internal banks 41 and 42 may have inclined side surfaces, and light emitted from the light-emitting element 30 may travel toward the inclined side surface. As will be described below, the electrodes 21 and 22 disposed on the internal banks 41 and 42 may include a material having high reflectance, and light emitted from the light-emitting element 30 may be reflected from the electrodes 21 and 22 disposed on the side surfaces of the internal banks 41 and 42 and may be emitted in an upward direction of the first planarization layer 19. For example, the first internal bank 41 and the second internal bank 42 may provide the area in which the light-emitting elements 30 may be disposed and, at the same time, may serve as a reflective partition wall that reflects light emitted from the light-emitting element 30 upward. In an embodiment, the internal banks 41 and 42 may include an organic insulating material such as PI, but the disclosure is not limited thereto.

The electrodes 21 and 22 may be disposed on the internal banks 41 and 42 and the first planarization layer 19. The electrodes 21 and 22 may be electrically connected to the light-emitting elements 30, and a certain voltage may be applied thereto such that the light-emitting elements 30 emit light having a specific wavelength. At least a portion of each of the electrodes 21 and 22 may be used to form an electric field in the pixel PX so as to arrange the light-emitting elements 30.

The electrodes 21 and 22 may include the first electrode 21 disposed on the first internal bank 41 and the second electrode 22 disposed on the second internal bank 42.

The first electrode 21 and the second electrode 22 may respectively include electrode stems 21S and 22S disposed to extend in the first direction DR1 and at least one electrode branch 21B and at least one electrode branch 22B which branch off from the electrode stems 21S and 22S and extend in the second direction DR2 that is a direction intersecting the first direction DR1.

The first electrode 21 may include a first electrode stem 21S disposed to extend in the first direction DR1 and at least one first electrode branch 21B branching off from the first electrode stem 21S and extending in the second direction DR2.

Both ends of the first electrode stem 21S may be disposed between the pixels PX to be spaced apart from each other, and the first electrode stem 21S may be disposed to be substantially collinear with the first electrode stem 21S of an adjacent pixel in the same row (for example, in the first direction DR1). Since both ends of the first electrode stems 21S disposed in the pixels PX may be spaced apart from each other, different electrical signals may be applied to the first electrode branches 21B, and each of the first electrode branches 21B may be driven separately. The first electrode 21 may be in contact with the first conductive pattern CDP through a first contact hole CT1 passing through the first planarization layer 19 and thus may be electrically connected to the first source/drain electrode DT_SD1 of the transistor DT.

The first electrode branch 21B may branch off from at least a portion of the first electrode stem 21S and may be disposed to extend in the second direction DR2 and may be disposed apart from the second electrode stem 22S disposed to face the first electrode stem 21S.

The second electrode 22 may include a second electrode stem 22S extending in the first direction DR1 and facing the first electrode stem 21S and a second electrode branch 22B branching off from the second electrode stem 22S and extending in the second direction DR2.

The second electrode stem 22S may extend in the first direction DR1 and may be disposed beyond a boundary with another adjacent pixel PX. The second electrode stem 22S traversing the pixels PX may be connected to an outer peripheral portion of the display area DA or a portion extending from the non-display area NDA in a direction from the non-display area NDA. The second electrode 22 may be in contact with the second voltage line VL2 through a second contact hole CT2 passing through the first planarization layer 19. As shown in the drawing, the second electrodes 22 of adjacent pixels PX in the first direction DR1 may be connected to a second electrode stem 22S and electrically connected to the second voltage line VL2 through the second contact hole CT2. However, the disclosure is not limited thereto, and in some cases, the second contact hole CT2 may also be formed at each pixel PX.

The second electrode branch 22B may be spaced apart from and face the first electrode branch 21B and may be disposed apart state from the first electrode stem 21S. The second electrode branch 22B may be connected to the second electrode stem 22S, and an end thereof in an extending direction may be disposed in the pixel PX to be spaced apart from the first electrode stem 21S.

Although two first electrode branches 21B and one second electrode branch 22B are illustrated in the drawing as being disposed in each pixel PX, the disclosure is not limited thereto. In some embodiments, more first electrode branches 21B and more second electrode branches 22B may be disposed in each pixel PX. The first electrode 21 and the second electrode 22 disposed in each pixel PX may not necessarily have a shape extending in a direction and may be disposed in various structures.

The first electrode 21 and the second electrode 22 may be respectively disposed on the first internal bank 41 and the second internal bank 42 and may be spaced apart from and face each other. In the first electrode 21 and the second electrode 22, the electrode branches 21B and 22B may be respectively disposed on the first internal bank 41 and the second internal bank 42, and at least partial areas thereof may be disposed directly on the first planarization layer 19. At least one end portion of the light-emitting elements 30 disposed between the first internal bank 41 and the second internal bank 42 may be electrically connected to the first electrode 21 and the second electrode 22.

Each of the electrodes 21 and 22 may include a transparent conductive material. For example, each of the electrodes 21 and 22 may include a material such as ITO, IZO, or indium tin-zinc oxide (ITZO), but the disclosure is not limited thereto. In some embodiments, each of the electrodes 21 and 22 may include a conductive material having high reflectance. For example, each of the electrodes 21 and 22 may include a metal having high reflectance such as silver (Ag), copper (Cu), and/or aluminum (Al). Light incident on each of the electrodes 21 and 22 may be reflected and emitted in an upward direction of each pixel PX.

Each of the electrodes 21 and 22 may have a structure in which each of a transparent conductive material and a metal layer having high reflectance may be stacked as one or more layers or may be formed as one layer including the transparent conductive material and the metal layer having high reflectance. In an embodiment, each of the electrodes 21 and 22 may have a stacked structure such as ITO/Ag/ITO/IZO or may include an alloy including aluminum (Al), nickel (Ni), lanthanum (La), or the like. However, the disclosure is not limited thereto.

The electrodes 21 and 22 may be electrically connected to the light-emitting elements 30, and a certain voltage may be applied thereto such that the light-emitting elements 30 emit light. For example, the electrodes 21 and 22 may be electrically connected to the light-emitting elements 30 through the contact electrodes 26 to be described below and may transmit electrical signals applied to the electrodes 21 and 22 to the light-emitting elements 30 through the contact electrodes 26.

In an embodiment, the first electrode 21 may be a separate pixel electrode for each pixel PX, and the second electrode 22 may be a common electrode commonly connected to each pixel PX. Any one of the first electrode 21 and the second electrode 22 may be an anode of the light-emitting element 30, and another thereof may be a cathode of the light-emitting element 30. However, the disclosure is not limited thereto, and the reverse may well be the case.

Each of the electrodes 21 and 22 may be used to form an electric field in the pixel PX to arrange the light-emitting elements 30. Through a process of forming an electric field between the first electrode 21 and the second electrode 22 by applying an arrangement signal to the first electrode 21 and the second electrode 22, the light-emitting elements 30 may be disposed between the first electrode 21 and the second electrode 22. The light-emitting elements 30 may be sprayed on the first electrode 21 and the second electrode 22 through an inkjet printing process in a state of being dispersed in an ink and may be arranged between the first electrode 21 and the second electrode 22 through a method of applying an arrangement signal between the first electrode 21 and the second electrode 22 to apply a dieletrophoretic force to the light-emitting elements 30.

The first insulating layer 51 may be disposed on the first planarization layer 19, the first electrode 21, and the second electrode 22. The first insulating layer 51 may be disposed to partially cover the first electrode 21 and the second electrode 22. The first insulating layer 51 may be disposed to cover most of upper surfaces of the first electrode 21 and the second electrode 22 and may expose portions of the first electrode 21 and the second electrode 22. The first insulating layer 51 may be disposed to expose portions of the upper surfaces of the first electrode 21 and the second electrode 22, for example, a portion of an upper surface of the first electrode branch 21B disposed on the first internal bank 41 and a portion of an upper surface of the second electrode branch 22B disposed on the second internal bank 42. The first insulating layer 51 may be formed substantially on the entirety of the first planarization layer 19 and may include openings partially exposing the first electrode 21 and the second electrode 22.

In an embodiment, a portion of an upper surface of the first insulating layer 51 may be recessed to form a stepped portion between the first electrode 21 and the second electrode 22. In some embodiments, the first insulating layer 51 may include an inorganic insulating material. A portion of the upper surface of the first insulating layer 51 disposed to cover the first electrode 21 and the second electrode 22 may be recessed due to a stepped portion of a member disposed thereunder. An empty space may be formed between the light-emitting elements 30, which may be disposed on the first insulating layer 51 between the first electrode 21 and the second electrode 22, and the recessed upper surface of the first insulating layer 51. The light-emitting element 30 may be disposed partially apart from the upper surface of the first insulating layer 51, and a material constituting the second insulating layer 52 to be described below may fill the space. However, the disclosure is not limited thereto. The first insulating layer 51 may have a flat upper surface such that the light-emitting element 30 may be disposed thereon.

The first insulating layer 51 may protect the first electrode 21 and the second electrode 22 and, at the same time, may insulate the first electrode 21 and the second electrode 22 from each other. The first insulating layer 51 may prevent the light-emitting element 30 disposed on the first insulating layer 51 from being damaged by being in direct contact with other members. However, the shape and structure of the first insulating layer 51 is not limited thereto.

The external bank 45 may be disposed on the first insulating layer 51. In some embodiments, the external bank 45 may be disposed at boundaries between the pixels PX on the first insulating layer 51 by surrounding areas in which the internal banks 41 and 42 and the electrodes 21 and 22 may be disposed and an area in which the light-emitting elements 30 may be disposed. The external bank 45 may be disposed in the non-emission area NEA. The external bank 45 may be disposed to have a shape extending in the first direction DR1 and the second direction DR2 and form a grid pattern in an entire surface of the display area DA.

According to an embodiment, a height of the external bank 45 may be greater than a height of the internal banks 41 and 42. Unlike the internal banks 41 and 42, the external bank 45 may divide adjacent pixels PX and, at the same time, may perform a function of preventing inks from overflowing to the adjacent pixels PX in an inkjet printing process of arranging the light-emitting elements 30 in the manufacturing process of the display device 1. The external bank 45 may separate the inks, in which different light-emitting elements 30 may be dispersed for different pixels PX, so as to not be mixed with each other. Like the internal banks 41 and 42, the external bank 45 may include PI, but the disclosure is not limited thereto.

The light-emitting elements 30 may be disposed between the electrodes 21 and 22. For example, the light-emitting elements 30 may be disposed between the electrode branches 21B and 22B. The light-emitting elements 30 may be disposed apart from each other and may be arranged substantially parallel to each other. A spacing interval between the light-emitting elements 30 is not particularly limited. In some cases, multiple light-emitting elements 30 may be disposed adjacent to each other to form a group, and multiple other light-emitting elements 30 may form a group in a state of being spaced apart from each other by a certain interval and may be disposed at non-uniform densities. In an embodiment, the light-emitting element 30 may have a shape extending in a direction, and an extending direction of each of the electrodes 21 and 22 may be substantially perpendicular to an extending direction of the light-emitting element 30. However, the disclosure is not limited thereto, and the light-emitting element 30 may be disposed to be inclined without being perpendicular to the extending direction of each of the electrodes 21 and 22.

The light-emitting elements 30 according to an embodiment may include active layers including different materials to emit light having different wavelengths to the outside. The display device 1 may include the light-emitting elements 30 which emit light having different wavelengths.

The light-emitting element 30 may be disposed on the first insulating layer 51 between the internal banks 41 and 42 or between the electrodes 21 and 22. For example, the light-emitting element 30 may be disposed on the first insulating layer 51 disposed between the internal banks 41 and 42. At the same time, the light-emitting element 30 may be disposed such that a partial area thereof overlaps each of the electrodes 21 and 22 in a thickness direction thereof. An end portion of the light-emitting element 30 may overlap the first electrode 21 in the thickness direction to be disposed on the first electrode 21, and another end portion of the light-emitting element 30 may overlap the second electrode 22 in the thickness direction to be disposed on the second electrode 22. However, the disclosure is not limited thereto, and although not shown in the drawings, at least some of the light-emitting elements 30 disposed in each pixel PX may be disposed in an area other than an area formed between the internal banks 41 and 42, for example, an area other than an area between the electrode branches 21B and 22B or an area between the internal banks 41 and 42 and the external bank 45.

An end portion of the light-emitting element 30 may be in contact with a first contact electrode 26a, and another end portion thereof may be in contact with a second contact electrode 26b. According to an embodiment, since an insulating film may not be formed on a surface of an extended end portion of the light-emitting element 30 in a direction and portions of semiconductor layers thereof may be exposed, the exposed semiconductor layers may be in contact with the first contact electrode 26a and the second contact electrode 26b which will be described below. However, the disclosure is not limited thereto. In some cases, in the light-emitting element 30, at least a portion of an insulating film may be removed, and the insulating film may be removed to partially expose side surfaces of both end portions of the semiconductor layers.

The second insulating layer 52 may be disposed on a portion of the light-emitting element 30 disposed between the first electrode 21 and the second electrode 22. The second insulating layer 52 may be disposed to partially surround an outer surface of the light-emitting element 30. A portion of the second insulating layer 52 disposed on the light-emitting element 30 may have a shape extending in the second direction DR2 between the first electrode 21 and the second electrode 22 in a plan view. As an example, the second insulating layer 52 may form a stripe-shaped or island-shaped pattern in each pixel PX.

The second insulating layer 52 may be disposed on the light-emitting element 30 and may expose an end portion and another end portion of the light-emitting element 30. The exposed end portion of the light-emitting element 30 may be in contact with the contact electrode 26 to be described below. A shape of the second insulating layer 52 may be formed through a patterning process using a material constituting the second insulating layer 52 using a typical mask process. A mask for forming the second insulating layer 52 may have a width that may be smaller than a length of the light-emitting element 30, and a material constituting the second insulating layer 52 may be patterned to expose both end portions of the light-emitting element 30. However, the disclosure is not limited thereto.

The contact electrodes 26 may be disposed on the first electrode 21, the second electrode 22, and the second insulating layer 52. The third insulating layer 53 may be disposed on any one of the contact electrodes 26.

The contact electrodes 26 may have a shape extending in a direction. The contact electrodes 26 may be in contact with the light-emitting elements 30 and the electrodes 21 and 22, and the light-emitting elements 30 may receive electrical signals from the first electrode 21 and the second electrode 22 through the contact electrodes 26.

The contact electrodes 26 may include the first contact electrode 26a and the second contact electrode 26b. The first contact electrode 26a and the second contact electrode 26b may be disposed on the first electrode 21 and the second electrode 22, respectively. Each of the first contact electrode 26a and the second contact electrode 26b may have a shape extending in the second direction DR2. The first contact electrode 26a and the second contact electrode 26b may be spaced apart from and face each other in the first direction DR1 and may form a stripe-shaped pattern in the emission area EMA of each pixel PX.

Portions of the upper surfaces of the first electrode 21 and the second electrode 22 may be exposed, and the first contact electrode 26a and the second contact electrode 26b may be in contact with the exposed upper surfaces of the first electrode 21 and the second electrode 22. For example, the first contact electrode 26a may be in contact with a portion of the first electrode 21 positioned on the first internal bank 41, and the second contact electrode 26b may be in contact with a portion of the second electrode 22 positioned on the second internal bank 42. However, the disclosure is not limited thereto, and in some cases, the first contact electrode 26a and the second contact electrode 26b may be formed to have a smaller width than the first electrode 21 and the second electrode 22 and thus may be disposed to cover only the exposed portions of the upper surfaces.

According to an embodiment, the semiconductor layers may be exposed at surfaces of both end portions of the light-emitting element 30 in the extending direction, and the first contact electrode 26a and the second contact electrode 26b may be in contact with the light-emitting elements 30 at the surfaces of the end portions at which the semiconductor layers may be exposed. However, the disclosure is not limited thereto. In some cases, the semiconductor layers may be exposed at side surfaces of both end portions of the light-emitting element 30, and each of the contact electrodes 26 may be in contact with the exposed semiconductor layer. An end portion of the light-emitting element 30 may be electrically connected to the first electrode 21 through the first contact electrode 26a, and another end portion of the light-emitting element 30 may be electrically connected to the second electrode 22 through the second contact electrode 26b.

Although two first contact electrodes 26a and one second contact electrode 26b may be illustrated in the drawing as being disposed in one pixel PX, the disclosure is not limited thereto. The number of the first contact electrodes 26a and the second contact electrodes 26b may vary according to the number of the first electrode branches 21B and the second electrode branches 22B disposed in each pixel PX.

The contact electrode 26 may include a conductive material. For example, the contact electrode 26 may include ITO, IZO, ITZO, aluminum (Al), or the like. For example, the contact electrode 26 may include a transparent conductive material, and light emitted from the light-emitting element 30 may pass through the contact electrode 26 to travel toward the electrodes 21 and 22. Each of the electrodes 21 and 22 may include a material having high reflectance, and the electrodes 21 and 22 disposed on the inclined side surfaces of the internal banks 41 and 42 may reflect incident light in an upper direction of the first substrate 11. However, the disclosure is not limited thereto.

The third insulating layer 53 may be disposed on the first contact electrode 26a. The third insulating layer 53 may electrically insulate the first contact electrode 26a and the second contact electrode 26b from each other. The third insulating layer 53 may be disposed to cover the first contact electrode 26a and may not be disposed on another end portion of the light-emitting element 30 such that the light-emitting element 30 may be in contact with the second contact electrode 26b. The third insulating layer 53 may be in partial contact with the first contact electrode 26a and the second insulating layer 52 on an upper surface of the second insulating layer 52. A side surface of the third insulating layer 53 in a direction in which the second electrode 22 may be disposed may be aligned with a side surface of the second insulating layer 52. The third insulating layer 53 may also be disposed in the non-emission area, for example, on the first insulating layer 51 disposed on the first planarization layer 19. However, the disclosure is not limited thereto.

The fourth insulating layer 54 may be disposed on the entirety of the first substrate 11. The fourth insulating layer 54 may serve to protect members disposed on the first substrate 11 from an external environment.

Each of the first insulating layer 51, the second insulating layer 52, the third insulating layer 53, and the fourth insulating layer 54 may include an inorganic insulating material or an organic insulating material. In an embodiment, the first insulating layer 51, the second insulating layer 52, the third insulating layer 53, and the fourth insulating layer 54 may include an inorganic insulating material such as silicon oxide (SiOx), silicon nitride (SiNx), silicon oxynitride (SiOxNy), aluminum oxide (Al2O3), or aluminum nitride (AlN). In other embodiments, the first insulating layer 51, the second insulating layer 52, the third insulating layer 53, and the fourth insulating layer 54 may include an organic insulating material such as an acrylic resin, an epoxy resin, a phenol resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, the disclosure is not limited thereto.

Figure 6:
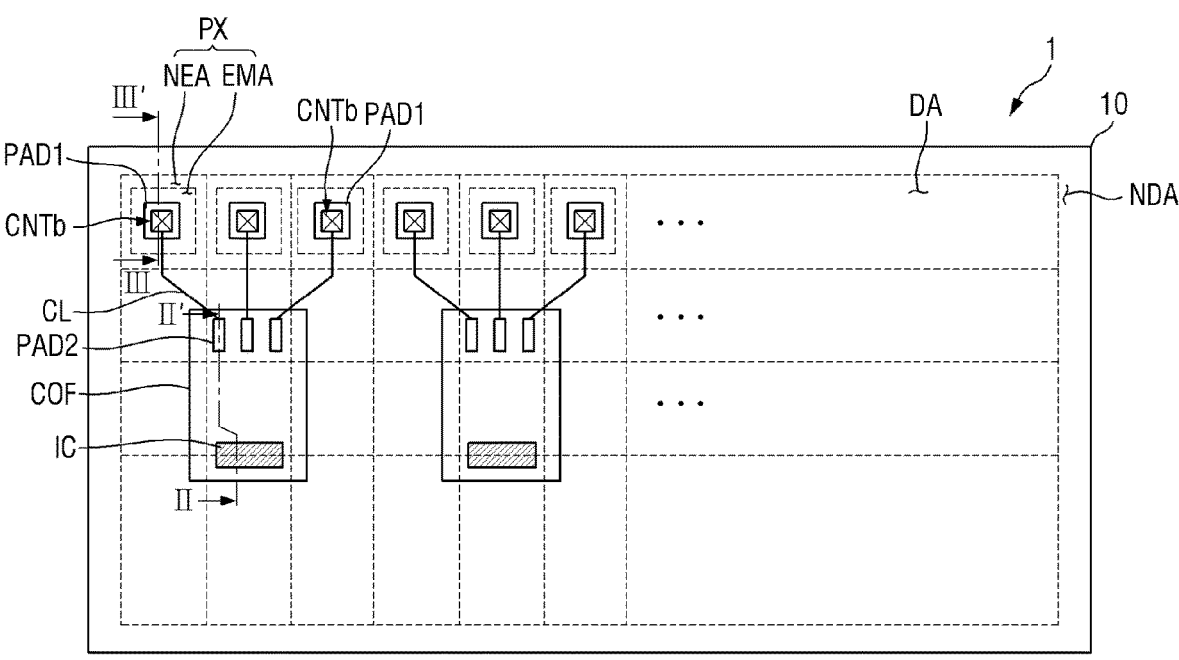
FIG. 6 is a schematic plan view of the display device viewed from below according to an embodiment.
Figure 6:
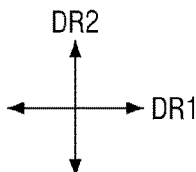

FIG. 6 is a schematic plan view of the display device viewed from below according to an embodiment.

Referring to FIG. 6, the data lines DL may be connected to the substrate connection electrodes CNTb. The data line DL may be connected to the first pad PAD1 (see FIGS. 6 and 7) through the data connection electrode CNTa (see FIG. 7), the etching stopper ES (see FIG. 7), and the substrate connection electrode CNTb.

Connection lines CL may be disposed on another surface (e.g., second surface) of the first substrate 11. An end portion of the connection line CL may constitute the first pad PAD1, and another end portion of the connection line CL may constitute a second pad PAD2. Although it has been described in FIG. 6 that an end portion of the connection line CL may constitute the first pad PAD1, and another end portion of the connection line CL may constitute the second pad PAD2, it may be understood that the connection line CL may be connected to each of the first pad PAD1 and the second pad PAD2. The second pad PAD2 may have a one-to-one correspondence with the connection line CL. The second pad PAD2 may be provided as multiple second pads PAD2. The second pads PAD2 may be arranged in the first direction DR1. Some of the connection lines CL may be connected to the first pad PAD1, extend downward in the second direction DR2, and include at least one bent portion.

For example, the connection lines CL may each include an extension portion extending from an end portion of the connection line CL in the second direction DR2 and a fan-out line disposed between the bent portion and the second pad PAD2. Adjacent connection lines CL may approach each other on the fan-out line. An end portion of the fan-out line may be connected to the extension portion of the connection line CL, and another end portion of the fan-out line may be connected to the second pad PAD2.

A chip-on-film COF may be disposed on adjacent second pads PAD2. The chip-on-film COF may be attached onto the adjacent second pads PAD2. The chip-on-film COF may be provided as multiple chip-on-films COF. The chip-on-film COF may be arranged apart from each other in the first direction DR1. The adjacent second pads PAD2 may form a pad group. The pad group may be provided as multiple pad groups. The pad groups may be arranged apart from each other in the first direction DR1. Each pad group may be connected to different chip-on-films COF. A driving chip IC may be mounted on the chip-on-film COF. The chip-on-film COF may be disposed in the display area DA of the display device 1. The chip-on-film COF may be disposed on another surface of the first substrate 11 of the display device 1 and may be disposed in the display area DA, thereby preventing a dead space (less-utilized) from being generated due to the arrangement of the chip-on-film COF.

Figure 7:
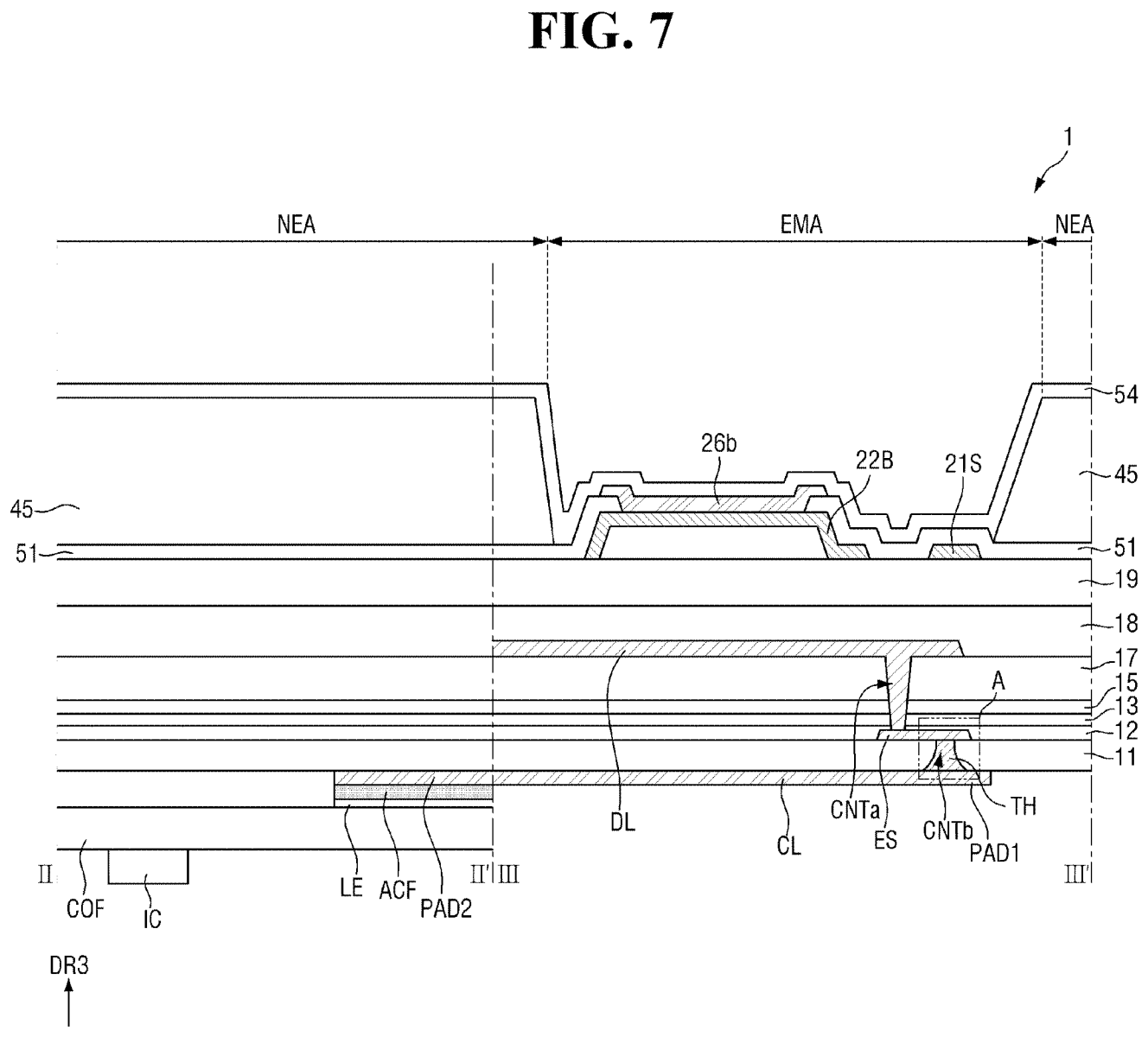

FIG. 7 shows schematic cross-sectional views taken along lines II-II' and III-III' of FIGS. 3 and 6. In the description of FIG. 7, redundant descriptions of the same components as those of FIG. 5 will be omitted.

Referring to FIGS. 5 and 7, the etching stopper ES may be disposed on a surface of the first substrate 11. The etching stopper ES may be disposed to be coplanar with the light blocking layers BML1 and BML2. The etching stopper ES may be disposed directly on a surface (e.g., first surface) of the first substrate 11. The etching stopper ES may include the same material as the light blocking layers BML1 and BML2. The etching stopper ES may be disposed apart from the light blocking layers BML1 and BML2. The etching stopper ES may cover a substrate through-hole TH. A width of the etching stopper ES may be greater than a width W1 of the substrate through-hole TH (see FIG. 8).

The data line DL may be positioned to be coplanar with the first data conductive layer illustrated with reference to FIG. 5. The data line DL may be disposed to be coplanar with the first source/drain electrode DT_SD1 and the second source/drain electrode DT_SD2 disposed on the first data conductive layer and may include the same material as the first source/drain electrode DT_SD1 and the second source/drain electrode DT_SD2.

The data line DL may be connected to the etching stopper ES through the data connection electrode CNTa passing through the first interlayer insulating layer 17, the first protective layer 15, and the first gate insulating layer 13. The data connection electrode CNTa may include the same material as the data line DL. The data line DL and the etching stopper ES may be electrically connected through the data connection electrode CNTa.

The first substrate 11 may include the substrate through-hole TH. The substrate through-hole TH may completely pass through the first substrate 11 in a thickness direction from a surface to another surface of the first substrate 11. The substrate through-hole TH may be disposed in the emission area EMA.

The substrate connection electrode CNTb may fill the substrate through-hole TH. The substrate connection electrode CNTb may completely fill the substrate through-hole TH. The substrate connection electrode CNTb may be in contact with side surfaces (or inner surfaces), with which the substrate through-hole TH may be in contact, of the first substrate 11. The substrate connection electrode CNTb may include a conductive material. For example, the substrate connection electrode CNTb may include at least one selected from among molybdenum (Mo), aluminum (Al), chromium (Cr), gold (Au), titanium (Ti), nickel (Ni), neodymium (Nd), and copper (Cu), or an alloy thereof. The substrate connection electrode CNTb may be formed as a single layer made of the above-described material. In some embodiments, the substrate connection electrode CNTb may be formed as a multi-layer made of the above-described material. The substrate connection electrode CNTb may be connected to the etching stopper ES. The substrate connection electrode CNTb may be connected directly to the etching stopper ES. The substrate connection electrode CNTb may be electrically connected to the etching stopper ES.

The connection line CL may be disposed on another surface (or a rear surface, e.g., a second surface) of the first substrate 11. The connection line CL may be disposed directly on another surface of the first substrate 11. An end portion of the connection line CL may be connected to the first pad PAD1, and another end portion of the connection line CL may be connected to the second pad PAD2. The first pad PAD1 may overlap the substrate connection electrode CNTb in a thickness direction thereof and may be in direct contact with the substrate connection electrode CNTb. The first pad PAD1 may be electrically connected to the substrate connection electrode CNTb. The connection line CL, the first pad PAD1, and the second pad PAD2 may be disposed to be coplanar with each other and may include the same material. However, the disclosure is not limited thereto, and the connection line CL, the first pad PAD1, and the second pad PAD2 may include different materials.

The connection line CL may include a conductive material. For example, the connection line CL may include at least one selected from among molybdenum (Mo), aluminum (Al), chromium (Cr), gold (Au), titanium (Ti), nickel (Ni), neodymium (Nd), and copper (Cu), or an alloy thereof. The connection line CL may be formed as a single layer made of the above-described material. In some embodiments, the connection line CL may be formed as a multi-layer made of the above-described material.

The chip-on-film COF may be attached onto the second pad PAD2. The chip-on-film COF may include a lead line LE. An anisotropic conductive film ACF may be disposed between the lead line LE and the second pad PAD2. The lead line LE and the second pad PAD2 may be electrically connected to each other through the anisotropic conductive film ACF. The driving chip IC may be mounted on the chip-on-film COF. The driving chip IC may be mounted on another surface that may be opposite to a surface of the chip-on-film COF on which the lead line LE may be disposed, but the disclosure is not limited thereto. The lead line LE and the driving chip IC may be disposed on the same surface of the chip-on-film COF.

The driving chip IC may serve to apply a data signal to each data line DL. The data signal provided from the driving chip IC may be transmitted to the data line DL through the second pad PAD2, the connection line CL, the first pad PAD1, the substrate connection electrode CNTb, the etching stopper ES, and the data connection electrode CNTa.

Hereinafter, the shape of the substrate through-hole CNTb will be described with reference to FIG. 8.

Figure 8:
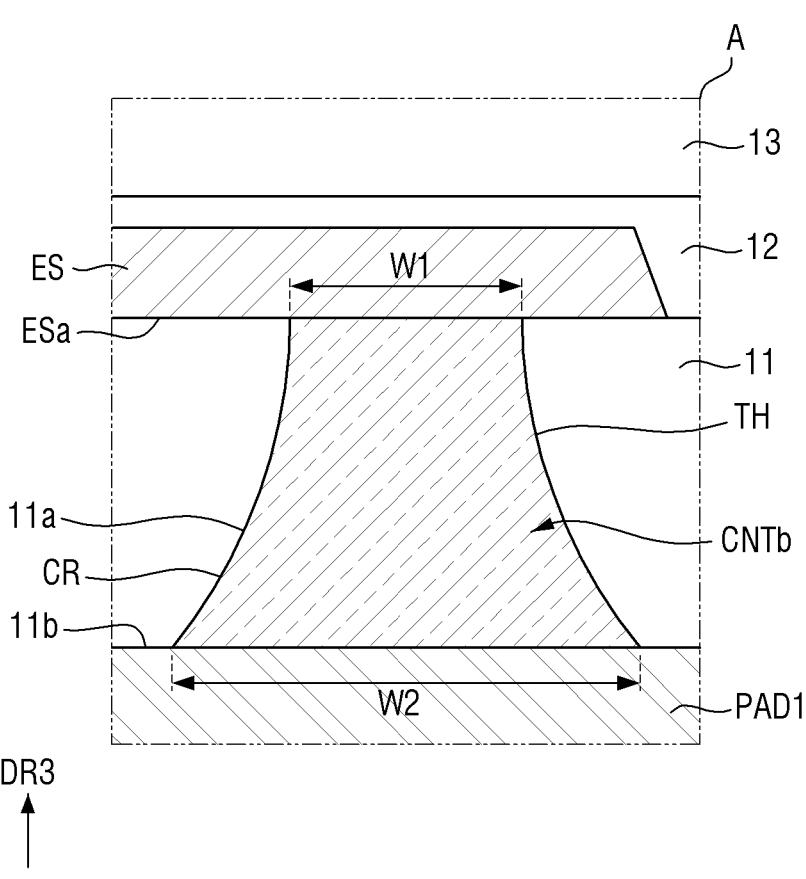
FIG. 8 is an enlarged schematic cross-sectional view of area A of FIG. 7.

FIG. 8 is an enlarged schematic cross-sectional view of area A of FIG. 7.

Referring to FIG. 8, the first substrate 11 may include the surface described with reference to FIG. 7 and another surface 11b. The first substrate 11 may further include side surfaces 11a in contact with the substrate through-hole CNTb.

The substrate through-hole TH may be surrounded by an extension of a surface of the first substrate 11, an extension of another surface 11b of the first substrate 11, and side surfaces 11a of the first substrate 11. The extension of a surface of the first substrate 11 may meet each of a surface of adjacent first substrates 11. The extension of another surface of the first substrate 11 may meet each of other surfaces of the adjacent first substrates 11. Each of the side surfaces 11a of the first substrate 11 may connect a point at which the extension of a surface of the first substrate 11 and a surface of the first substrate 11 meet each other and a point at which the extension of another surface 11b of the first substrate 11 and another surface 11b of the first substrate 11 meet each other.

A width of the substrate through-hole TH may gradually decrease in a direction from the extension of another surface 11b of the first substrate 11 toward the extension of a surface of the first substrate 11. The width of the substrate through-hole TH may include a first width W1 equal to a length of the extension of a surface of the first substrate 11 and a second width W2 equal to a length of the extension of another surface 11b of the first substrate 11. In an embodiment, the first width W1 may be smaller than the second width W2.

The side surfaces 11a of the first substrate 11 constituting the substrate through-hole TH may form curved surfaces CR.

Each of the curved surfaces CR formed by the side surfaces 11a of the first substrate 11 may have a cross-sectional shape that may be convex toward the substrate through-hole TH.

Furthermore, a slope of the side surface 11a of the first substrate 11 may gradually increase in a direction from the point at which the extension of a surface of the first substrate 11 and a surface of the first substrate 11 meet each other toward the point at which the extension of another surface 11b of the first substrate 11 and another surface 11b of the first substrate 11 meet each other.

The substrate through-hole TH according to an embodiment may be formed through laser irradiation and wet etching.

For example, a laser may be irradiated onto an area in which the substrate through-hole TH may be formed. The laser may be a femtosecond laser. In the specification, the femtosecond laser may refer to a laser having a pulse width of 200 femtoseconds or more and 500 femtoseconds or less. However, the disclosure is not limited thereto, and the femtosecond laser may be light having a short wavelength from a near-infrared (IR) laser to an ultraviolet (UV) laser or light having a multi-wavelength including light with various wavelengths.

The laser may be irradiated from another surface of the first substrate to a surface thereof in contact with the etching stopper ES. A focus of the laser can be variously modified. In an embodiment, the laser may be focused on a surface of the first substrate, but the disclosure is not limited thereto.

In case that the laser is irradiated onto the area in which the substrate through-hole TH is to be formed, structural deformation may occur in the corresponding area. For example, a silicon (Si)-oxygen (O) bond of the example glass constituting the first substrate may be broken in the corresponding area. Therefore, etching selectivity of an etching solution for the corresponding area may be greater than etching selectivity of the etching solution for an area onto which the laser may not be irradiated.

After the laser may be irradiated, a whole surface of the first substrate may be etched. For the etching, wet etching may be applied. In an etching operation, as an etching solution, a basic solution such as potassium hydroxide (KOH) or sodium hydroxide (NaOH) or an acidic solution such as a hydrofluoric acid (HF) may be used. The wet etching may be performed over the whole surface of the first substrate.

As described above, since the etching selectivity of the etching solution for the area onto which the laser may be irradiated may be higher than the etching selectivity of the etching solution for the area onto which the laser may not be irradiated, as a result of the wet etching, the substrate through-hole TH may be formed in the area onto which the laser may be irradiated.

In the etching operation, etching selectivity of the etching solution for the first substrate may be much higher than etching selectivity thereof for the etching stopper ES. Accordingly, even in case that the etching solution comes into contact with the etching stopper ES in the etching operation, a surface of the etching stopper ES may not be substantially etched.

According to an embodiment, in case that the substrate through-hole TH may be formed, laser irradiation and etching may be performed together, thereby securing processing quality, a processing speed, and a high aspect ratio (thickness-to-width ratio of the substrate through-hole TH) of the substrate through-hole TH.

Furthermore, the width of the etching stopper ES may be formed to be greater than the width W1 of the substrate through-hole TH (see FIG. 8), thereby preventing an etching solution from being diffused into a surface of the first substrate in case that the substrate through-hole TH is formed. Thus, it may be possible to prevent corrosion and/or etching of the electrodes on the first substrate due to the etching solution.

Furthermore, the etching stopper ES may be formed at the same time that the light blocking layers BML1 and BML2 may be formed, thereby simplifying a manufacturing process without the addition of separate members and/or components.

As described above, since the substrate connection electrode CNTb may be disposed in the display area DA, the chip-on-film COF connected to the substrate connection electrode CNTb may be formed on another surface of the first substrate 11 of the display device 1 and may be disposed in the display area DA. Thus, it may be possible to reduce a dead space due to the arrangement of the chip-on-film COF and the fan-out line.

Hereinafter, a method of manufacturing the display device 1 according to an embodiment will be described.

In the following embodiments, the same components as those of the above described embodiments may be denoted by the same reference numerals, and descriptions thereof will be omitted or simplified.

FIGS. 9 to 14 are schematic cross-sectional views of process operations of a method of manufacturing a display device according to an embodiment.

Figure 9:
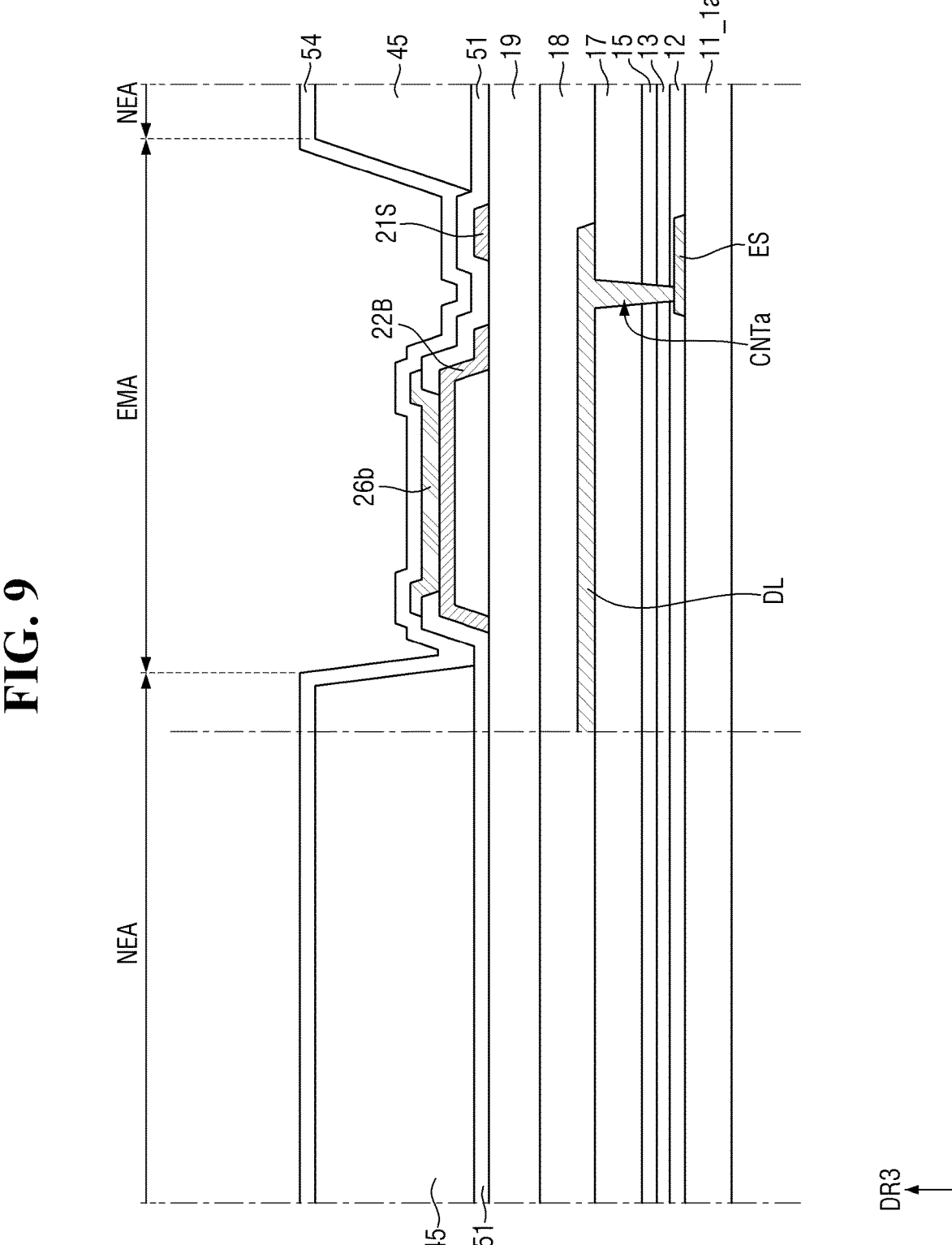

First, referring to FIGS. 9, 5, and 7 together, upper structures on the first substrate 11 described above with reference to FIGS. 5 and 7 may be formed on a first substrate 11_1a.

More specifically, light blocking layers BML1 and BML2 and an etching stopper ES may be formed on the first substrate 11_1a, and the buffer layer 12 described above with reference to FIGS. 5 and 7 and upper structures of the buffer layer 12 may be formed on the light blocking layers BML1 and BML2 and the etching stopper ES. The etching stopper ES may be disposed to be coplanar with the light blocking layers BML1 and BML2. The etching stopper ES may be disposed directly on a surface of the first substrate 11. The etching stopper ES may include the same material as the light blocking layers BML1 and BML2. The etching stopper ES may be disposed apart from the light blocking layers BML1 and BML2. The etching stopper ES may cover a substrate through-hole TH. A width of the etching stopper ES may be greater than a width W1 of the substrate through-hole TH (see FIG. 8).

A thickness of the first substrate 11_1a according to FIG. 9 may be greater than a thickness of the first substrate 11 according to FIGS. 5 and 7. Thereafter, a thickness of the entirety of the first substrate 11_1a may be reduced through wet etching.

Figure 10:
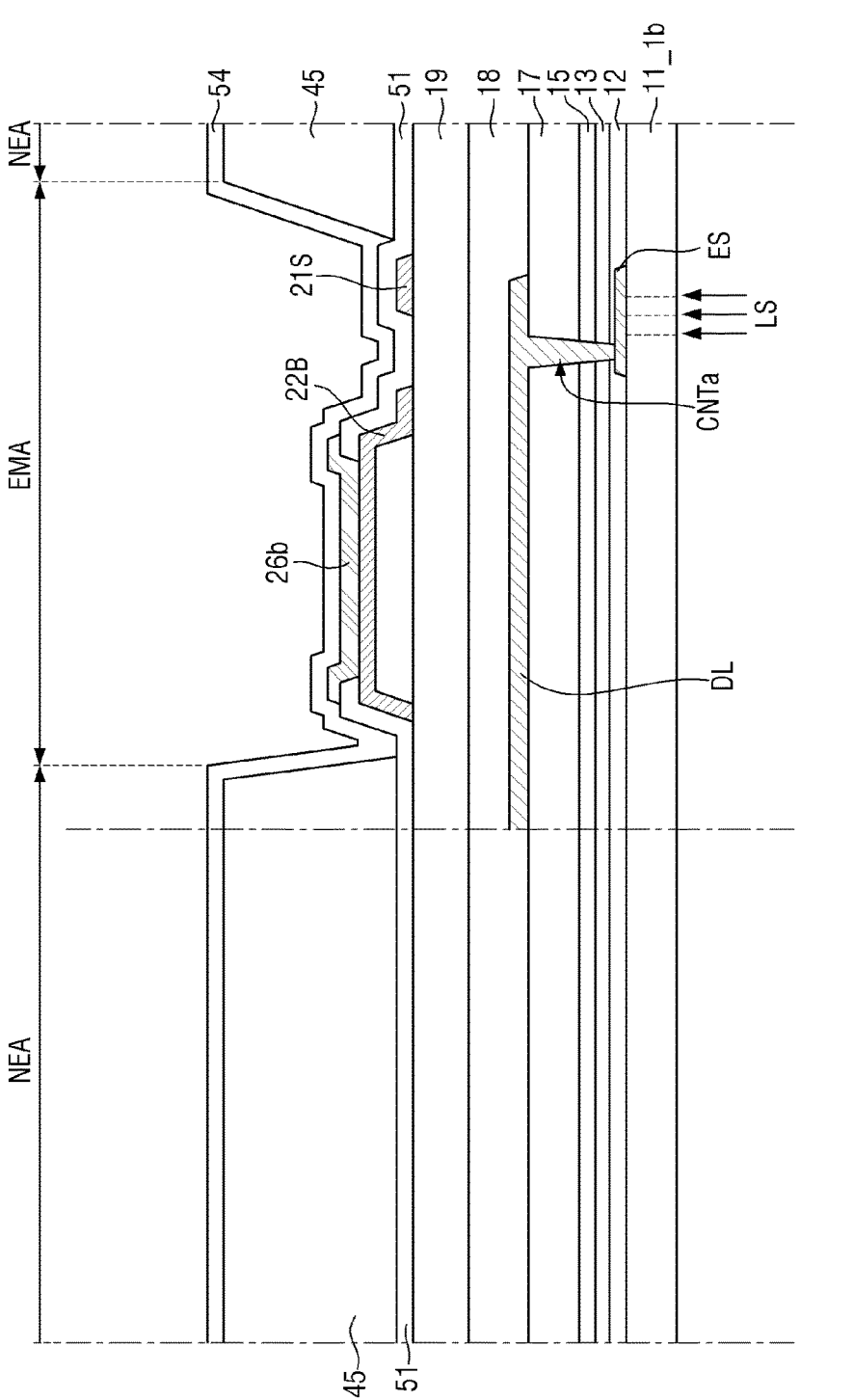

Referring to FIG. 10, as described above, a laser LS may be irradiated onto an area in which the substrate through-hole TH may be formed. The laser LS may be a femtosecond laser. In the specification, the femtosecond laser may refer to a laser having a pulse width of 200 femtoseconds or more and 500 femtoseconds or less. However, the disclosure is not limited thereto, and the femtosecond laser may be light having a short wavelength from an IR laser to a UV laser or light having a multi-wavelength including light with various wavelengths.

The laser LS may be irradiated from another surface 11b of the first substrate 11 (see of FIG. 9) to a surface in contact with the etching stopper ES. A focus of the laser LS can be variously modified. In an embodiment, the laser LS may be focused on a surface of the first substrate 11, but the disclosure is not limited thereto.

In case that the laser LS is irradiated onto the area in which the substrate through-hole TH is to be formed, a first substrate 11_1b may be formed. Structural deformation may occur in the area, onto which the laser LS may be irradiated, of the first substrate 11_1b. For example, a Si—O bond of example glass constituting the first substrate 11_1b may be broken in the corresponding area. Therefore, etching selectivity of an etching solution for the corresponding area may be higher than etching selectivity of the etching solution for an area onto which the laser may not be irradiated.

After the laser LS may be irradiated, a whole surface of the first substrate 11_1b may be etched. For the etching, wet etching may be applied. In an etching operation, as an etching solution, a basic solution such as potassium hydroxide (KOH) or sodium hydroxide (NaOH) or an acidic solution such as a hydrofluoric acid (HF) may be used. The wet etching may be performed over the whole surface of the first substrate 11_1b.

Figure 11:
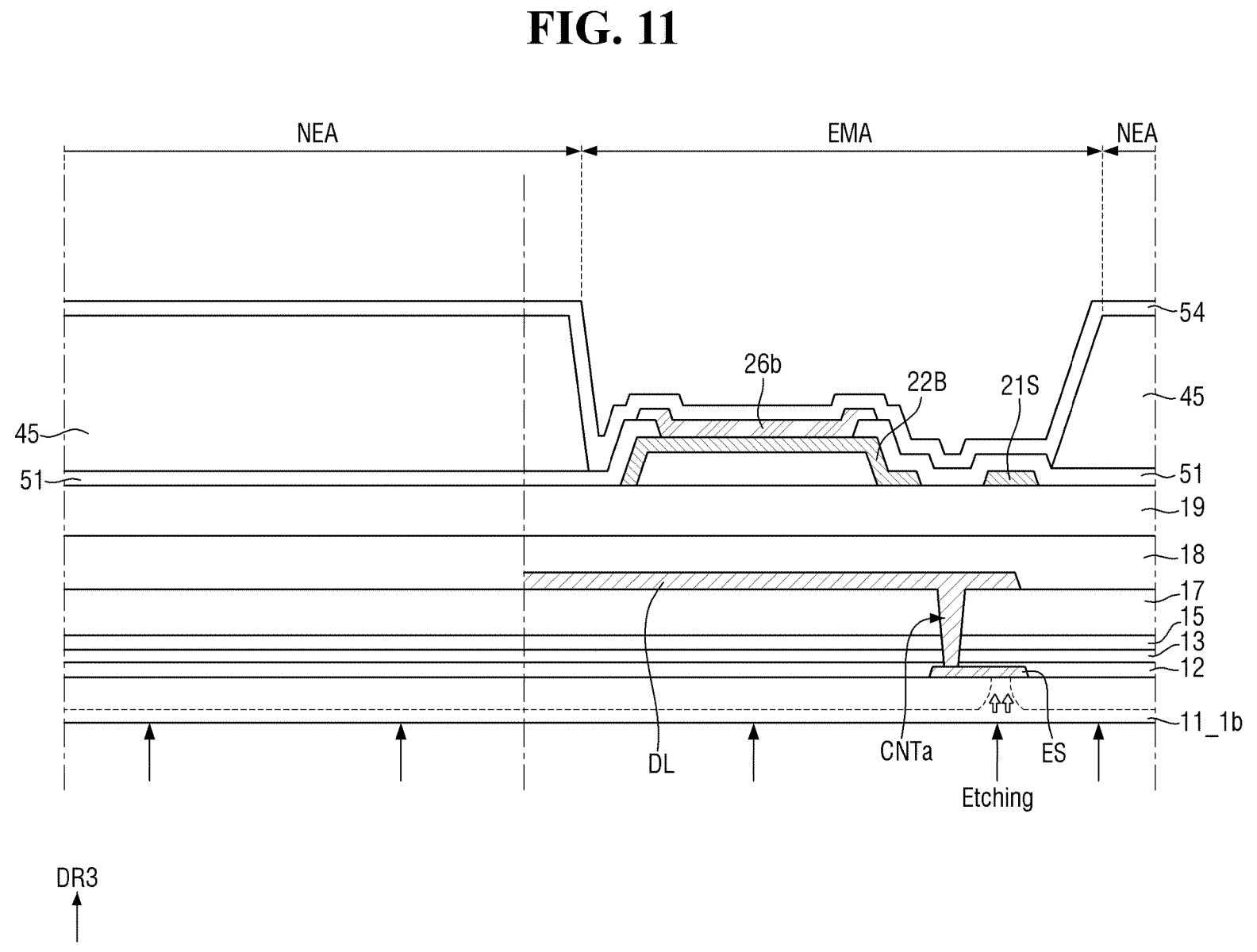

Since the first substrate 11_1b may be gradually etched from another surface 11b by the etching solution, a thickness thereof may be decreased. As described above, the etching selectivity of the etching solution for the area onto which the laser LS may be irradiated may be higher than the etching selectivity of the etching solution for the area onto which the laser LS may not be irradiated. Accordingly, as a result of the wet etching, as shown in FIGS. 11 and 7, the substrate through-hole TH may be formed in the area onto which the laser LS may be irradiated.

Figure 12:
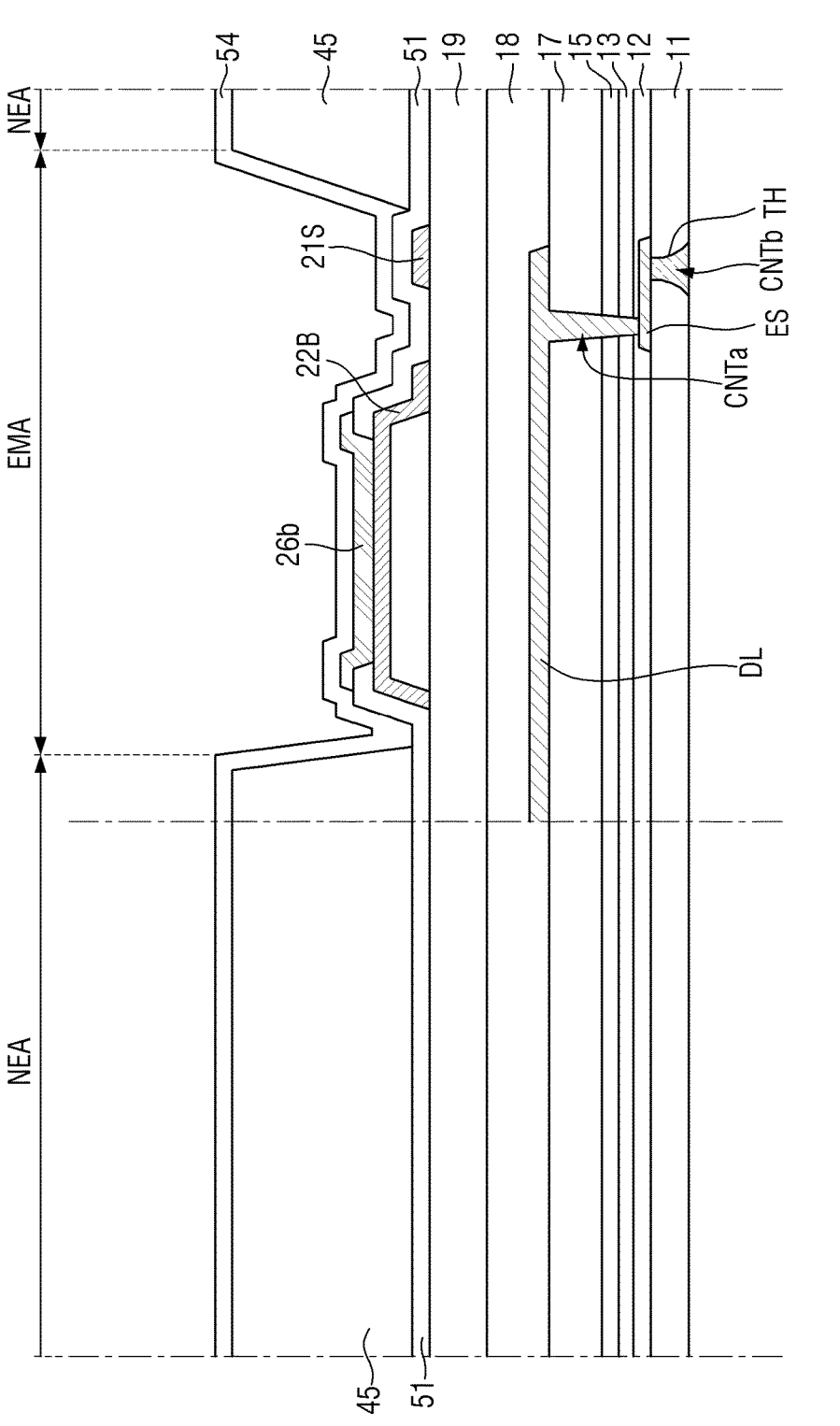

Referring to FIG. 12, the substrate through-hole TH may be filled with a substrate connection electrode CNTb.

The substrate connection electrode CNTb may include a conductive material. For example, the substrate connection electrode CNTb may include at least one selected from among molybdenum (Mo), aluminum (Al), chromium (Cr), gold (Au), titanium (Ti), nickel (Ni), neodymium (Nd), and copper (Cu), or an alloy thereof. The substrate connection electrode CNTb may be formed as a single layer made of the above-described material. In some embodiments, the substrate connection electrode CNTb may be formed as a multi-layer made of the above-described material. The substrate connection electrode CNTb may be connected to the etching stopper ES. The substrate connection electrode CNTb may be connected directly to the etching stopper ES. The substrate connection electrode CNTb may be electrically connected to the etching stopper ES.

Figure 13:
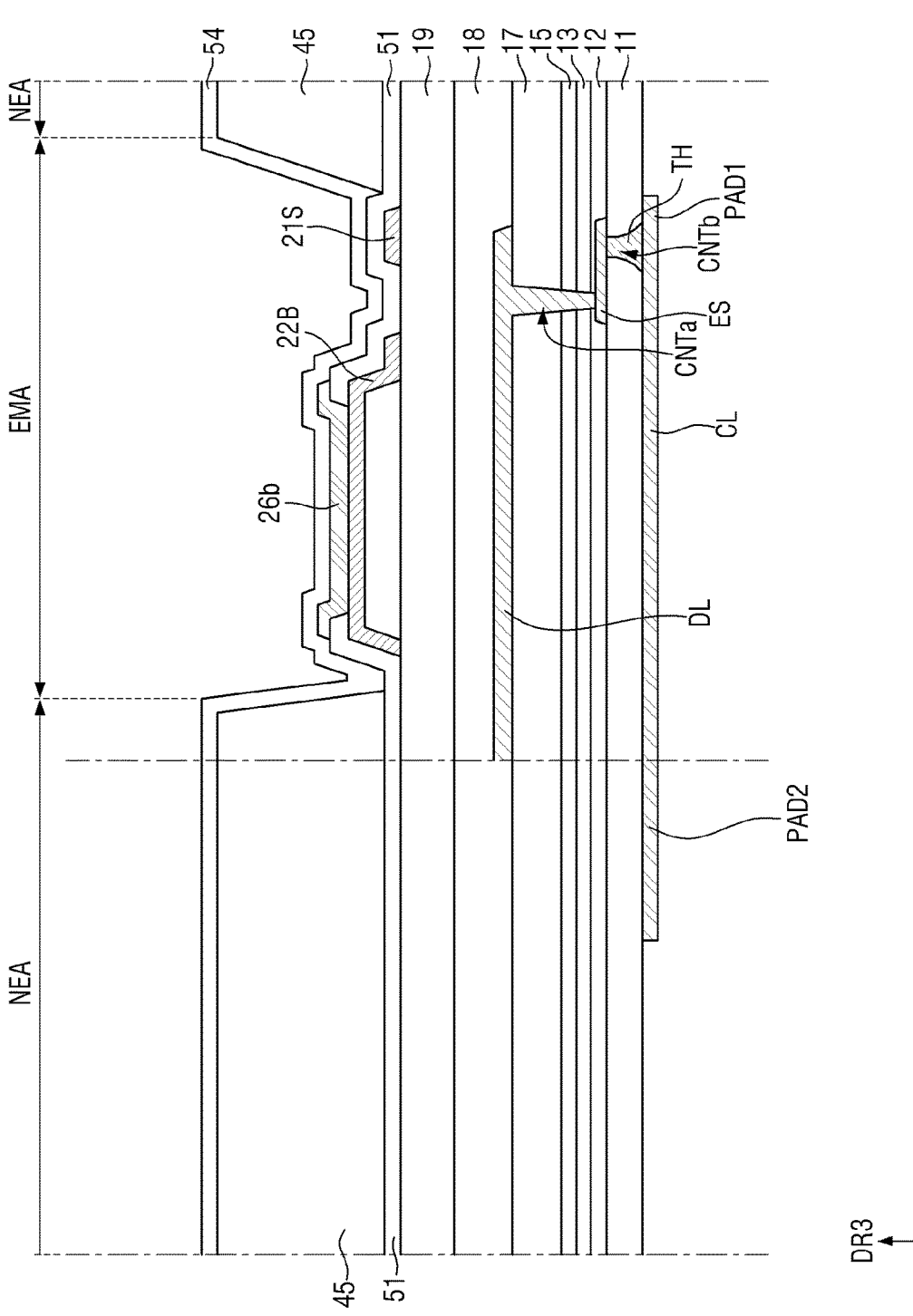

Subsequently, referring to FIG. 13, a first pad PAD1, a connection line CL, and a second pad PAD2 may be formed.

The first pad PAD1, the connection line CL, and the second pad PAD2 may each be disposed on another surface (or a rear surface, e.g., second surface) of the first substrate 11. An end portion of the connection line CL may be connected to the first pad PAD1, and another end portion of the connection line CL may be connected to the second pad PAD2. The first pad PAD1 may overlap the substrate connection electrode CNTb in a thickness direction thereof and may be in direct contact with the substrate connection electrode CNTb. The first pad PAD1 may be electrically connected to the substrate connection electrode CNTb. The connection line CL, the first pad PAD1, and the second pad PAD2 may be disposed to be coplanar with each other and may include the same material. However, the disclosure is not limited thereto, and the connection line CL, the first pad PAD1, and the second pad PAD2 may include different materials. The connection line CL may include a conductive material. For example, the connection line CL may include at least one selected from among molybdenum (Mo), aluminum (Al), chromium (Cr), gold (Au), titanium (Ti), nickel (Ni), neodymium (Nd), and copper (Cu), or an alloy thereof. The connection line CL may be formed as a single layer made of the above-described material. In some embodiments, the connection line CL may be formed as a multilayer made of the above-described material.

Figure 14:
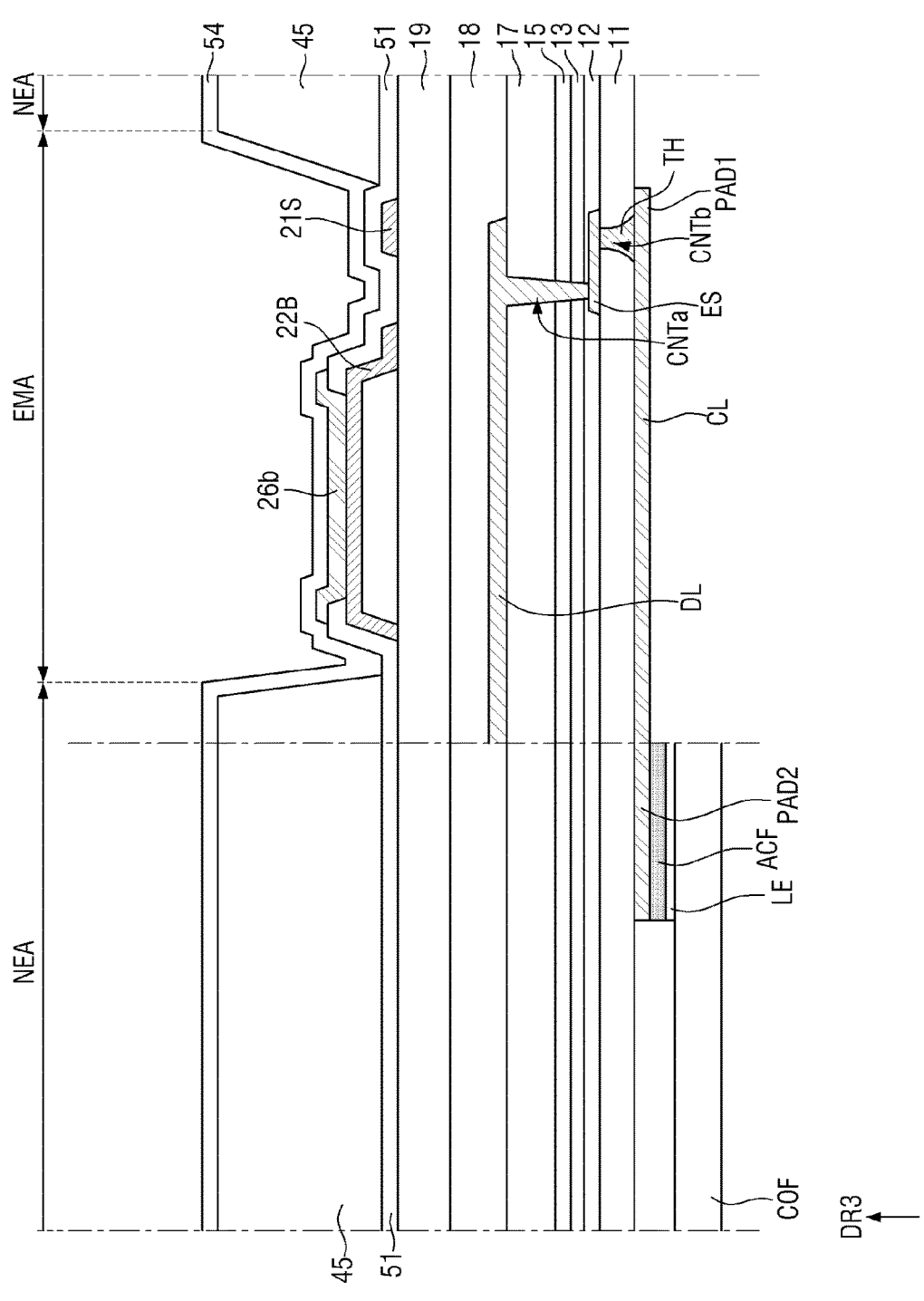

Referring to FIG. 14, a chip-on-film COF may be disposed on the second pad PAD2 through an anisotropic conductive film ACF.

A lead line LE of the chip-on-film COF may be electrically connected to the second pad PAD2 through the anisotropic conductive film ACF.

Hereinafter, other embodiment of a display device according to an embodiment will be described. In the following embodiments, the same components as those of the above-described embodiments are denoted by the same reference numerals, and descriptions thereof will be omitted or simplified.

Figure 15:
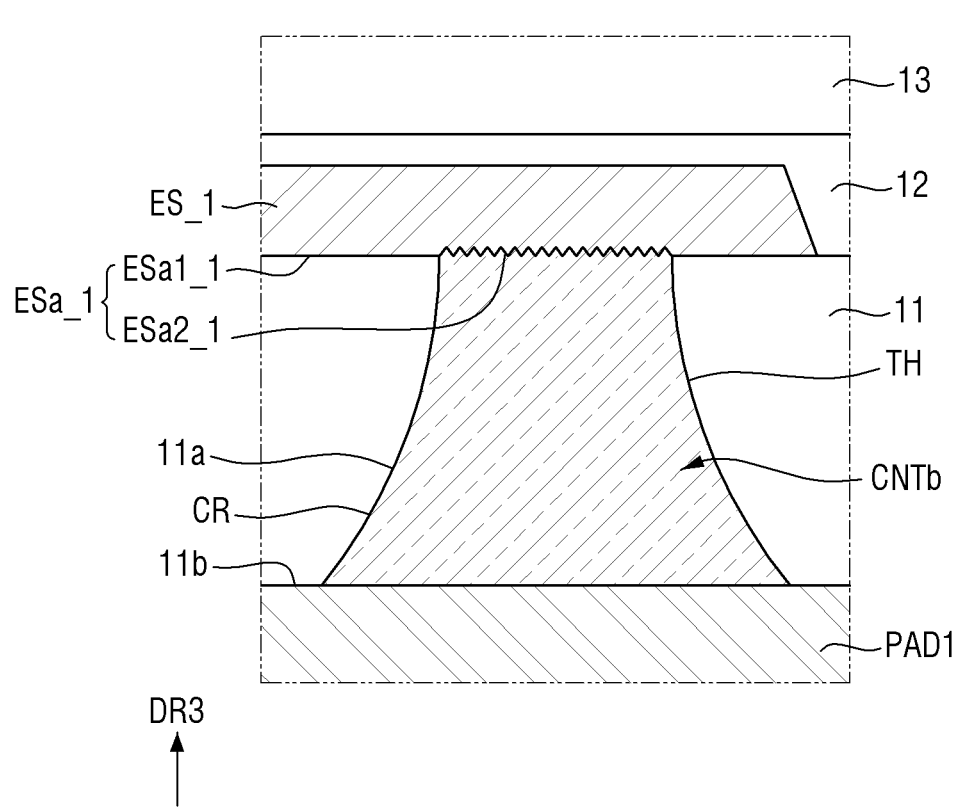
FIG. 15 is a schematic cross-sectional view of a display device according to another embodiment.

FIG. 15 is a cross-sectional view of a display device according to another embodiment.

Referring to FIG. 15, an etching stopper ES_1 according to an embodiment may be different from the etching stopper ES according to FIG. 8 at least in that a surface ESa_1 of the etching stopper ES_1 may include a first portion ESa1_1 and a second portion ESa2_1.

More specifically, a surface ESa_1 of the etching stopper ES_1 according to an embodiment may include the first portion ESa1_1 and the second portion ESa2_1. A surface roughness of the first portion ESa1_1 may be lower than a surface roughness of the second portion ESa2_1. The first portion ESa1_1 may be a portion not in contact with a substrate connection electrode CNTb, and the second portion ESa2_1 may be a portion in contact with the substrate connection electrode CNTb. A surface of the etching stopper ES_1, at which a first substrate 11 may be exposed, may be partially etched by an etching solution in an etching operation to form the second portion ESa2_1.

Since other descriptions have been made above with reference to FIG. 8, redundant descriptions will be omitted.

Figure 16:
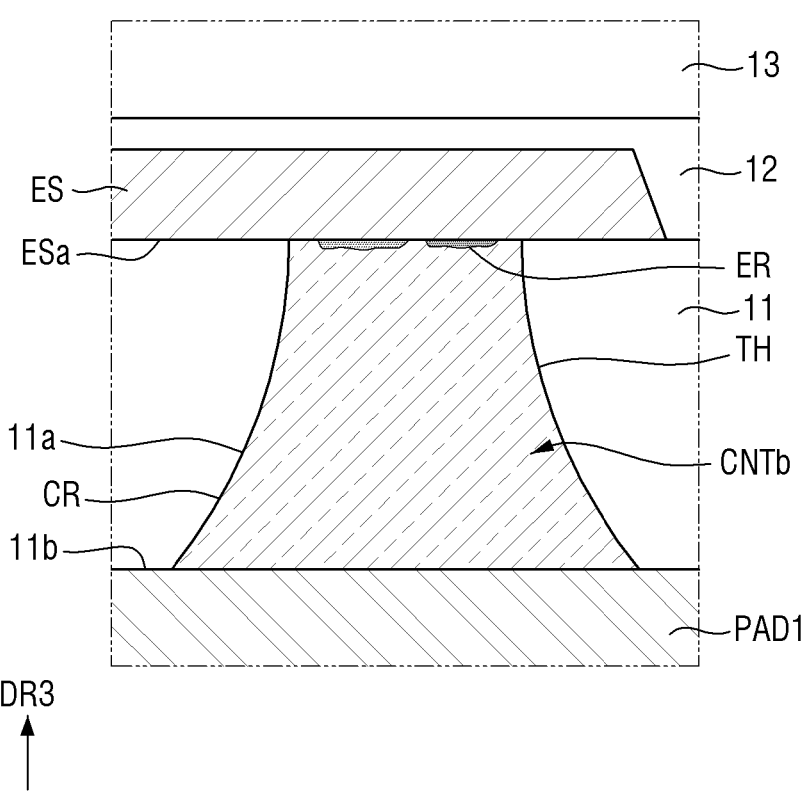
FIG. 16 is a schematic cross-sectional view of a display device according to still another embodiment.

FIG. 16 is a schematic cross-sectional view of a display device according to still another embodiment.

Referring to FIG. 16, an embodiment may be different from an embodiment of FIG. 8 at least in that an etching residue ER may remain on a surface ESa of an etching stopper ES in a substrate through-hole TH.

More specifically, the etching residue ER may remain on a surface ESa of the etching stopper ES in the substrate through-hole TH. In an embodiment, after the substrate through-hole TH may be formed, in case that a first substrate residue remains on a surface ESa of the etching stopper ES and may not be completely removed, the etching residue ER may be formed. The first substrate residue, that is, the etching residue ER, may include the same material as a first substrate 11. The etching residue ER may be in direct contact with a substrate connection electrode CNTb in the substrate through-hole TH. However, a structure formed by materials of the etching residue ER may be different from a structure formed by materials of the first substrate 11. For example, at least one of Si—O bonds in the etching residue ER may be in a state of being broken.

Since other descriptions have been made above with reference to FIG. 8, redundant descriptions will be omitted.

Figure 17:
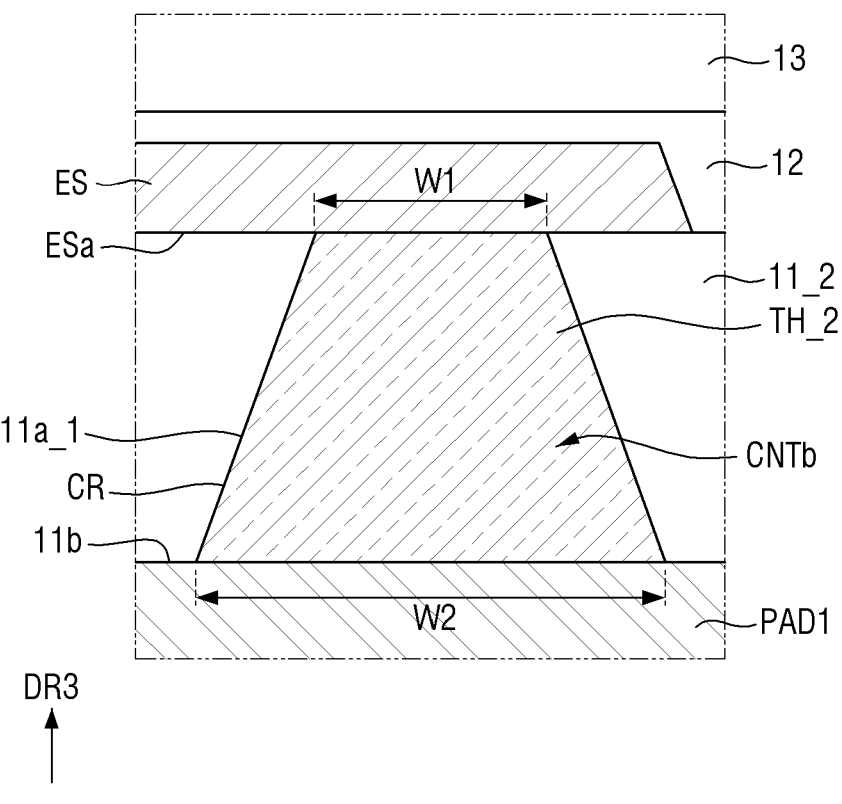
FIG. 17 is a schematic cross-sectional view of a display device according to yet another embodiment.

FIG. 17 is a schematic cross-sectional view of a display device according to yet another embodiment.

Referring to FIG. 17, a first substrate 11_2 and a substrate through-hole TH_2 according to an embodiment may be different from the first substrate 11 and the substrate through-hole TH according to FIG. 8 at least in that the first substrate 11_2 may include the substrate through-hole TH_2 and an inclined cross-sectional shape of a side surface 11a_1 of the first substrate 11_2 in contact with the substrate through-hole TH_2 may be a linear shape.

More specifically, the first substrate 11_2 according to an embodiment may include the substrate through-hole TH_2, and the inclined cross-sectional shape of the side surface 11a_1 of the first substrate 11_2 in contact with the substrate through-hole TH_2 may be the linear shape. For example, an inclination angle of the side surface 11a_1 of the first substrate 11_2 may be constant.

The side surface 11a_1 of an embodiment may be formed by adjusting an etching solution or an etching time in case that the substrate through-hole TH_2 may be formed.

In some cases, the side surface 11a_1 of an embodiment may be formed in case that dry etching is used to form the substrate through-hole TH_2.

Since other descriptions have been made above with reference to FIG. 8, redundant descriptions will be omitted.

Figure 18:
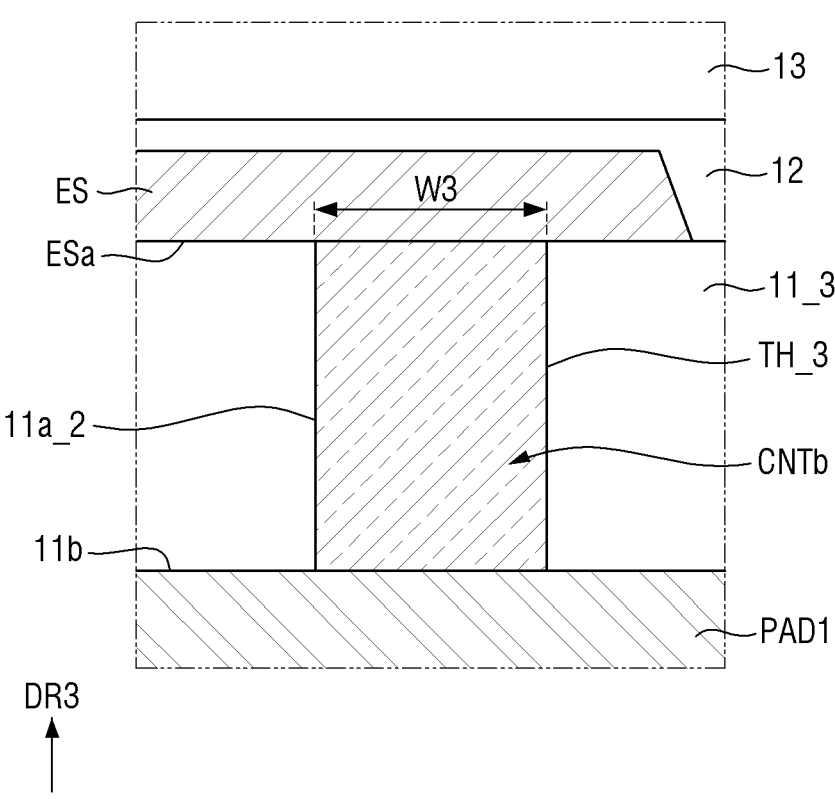
FIG. 18 is a schematic cross-sectional view of a display device according to yet another embodiment.

FIG. 18 is a schematic cross-sectional view of a display device according to yet another embodiment.

Referring to FIG. 18, a first substrate 11_3 and a substrate through-hole TH_3 according to an embodiment may be different from the first substrate 11 and the substrate through-hole TH according to FIG. 8 at least in that a width of the substrate through-hole TH_3 of the first substrate 11_3 equal to a length of an extension of a surface of the first substrate 11_3 may be the same as a width of the substrate through-hole TH_3 of the first substrate 11_3 equal to a length of an extension of another surface 11b of the first substrate 11_3. A side surface 11a_2 of the first substrate 11_3 may be substantially perpendicular to another surface 11b of the first substrate 11_3.

More specifically, the substrate through-hole TH_3 may have a third width W3, and the third width W3 may be constant from the extension of a surface of the first substrate 11_3 to another surface 11b of the first substrate 11_3.

In an embodiment, dry etching may be used to form the substrate through-hole TH_3. Since other descriptions have been made above with reference to FIG. 8, redundant descriptions will be omitted.

Figure 19:
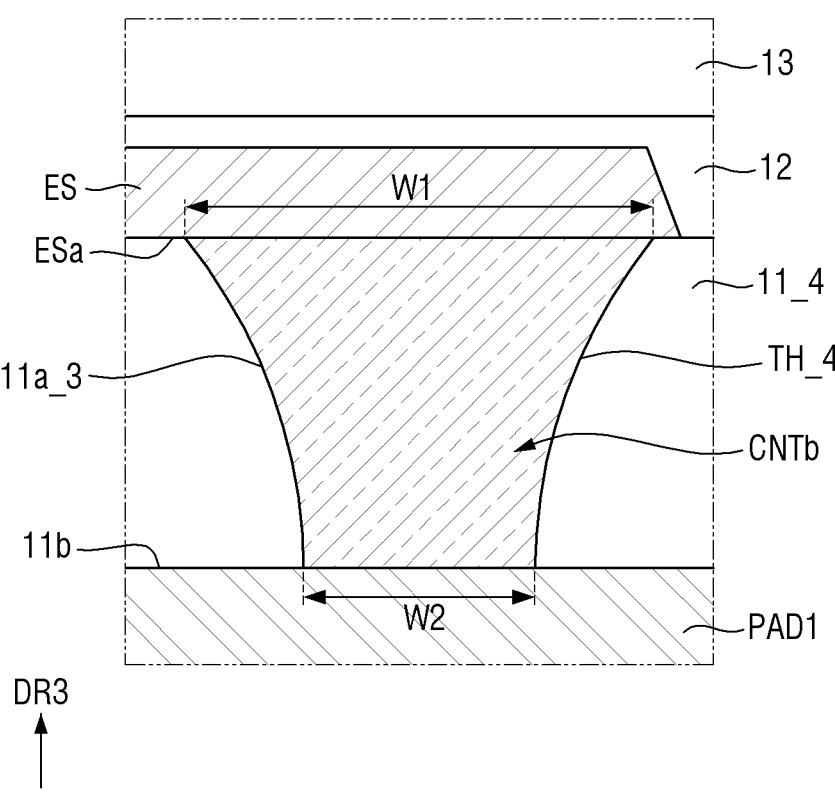
FIG. 19 is a schematic cross-sectional view of a display device according to yet another embodiment.

FIG. 19 is a schematic cross-sectional view of a display device according to yet another embodiment.

Referring to FIG. 19, a first substrate 11_4 and a substrate through-hole TH_3 may be different from the first substrate 11 and the substrate through-hole TH according to FIG. 8 in that a first width W1 of the substrate through-hole TH_4 of the first substrate 11_4 may be greater than a second width W2.

More specifically, the first substrate 11_4 and the substrate through-hole TH_3 according to an embodiment may be different from the first substrate 11_4 and the substrate through-hole TH_4 according to FIG. 8 at least in that a slope of a side surface 11a_3 of the first substrate 11_4 may gradually decrease in a direction from a point at which an extension of another surface 11b of the first substrate 11_4 and another surface 11b meet each other toward a point at which an extension of a surface of the first substrate 11_4 and a surface of the first substrate 11_4 meet each other.

Since other descriptions have been made above with reference to FIG. 8, redundant descriptions will be omitted.

Figure 20:
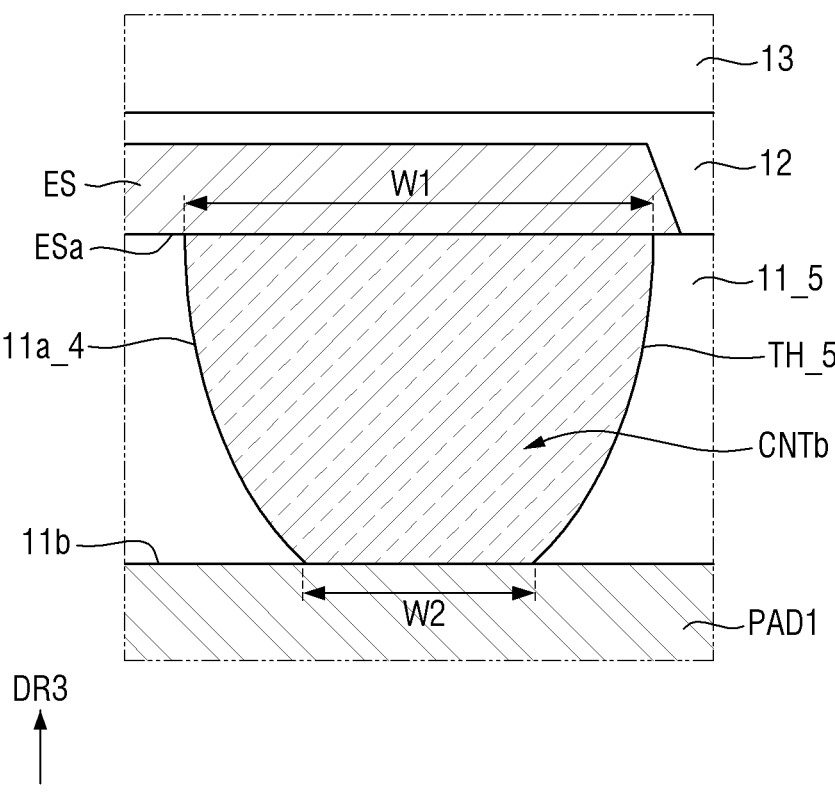
FIG. 20 is a schematic cross-sectional view of a display device according to yet another embodiment.

FIG. 20 is a schematic cross-sectional view of a display device according to yet another embodiment.

Referring to FIG. 20, a first substrate 11_5 and a substrate through-hole TH_5 according to an embodiment may be different from the first substrate 11_4 and the substrate through-hole TH_4 according to FIG. 19 at least in that curved surfaces formed by side surfaces 11a_4 of the substrate through-hole TH_5 of the first substrate 11_5 each may have a cross-sectional shape that may be convex in a direction opposite to the substrate through-hole TH_5.

Since other descriptions have been made above with reference to FIGS. 8 and 19, redundant descriptions will be omitted.

Figure 21:
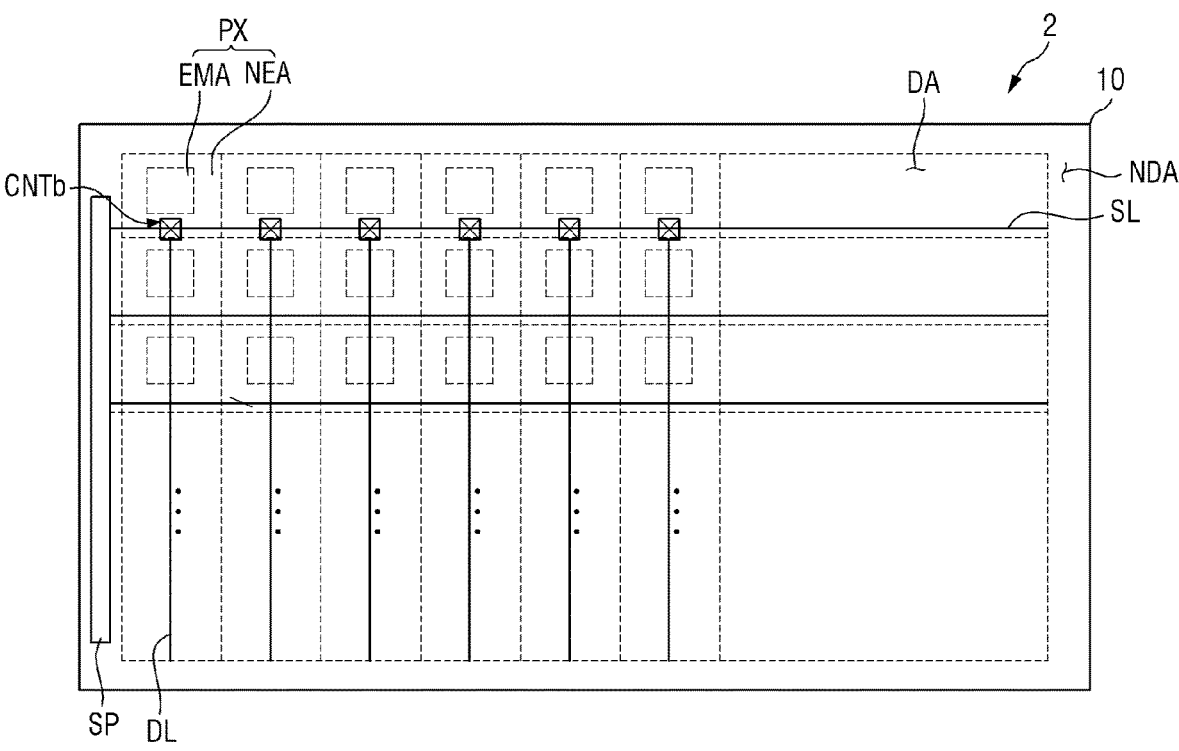
FIG. 21 is a schematic plan view of a display device viewed from above according to yet another embodiment.
Figure 21:
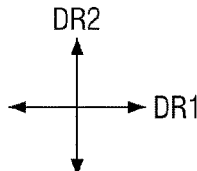
Figure 22:
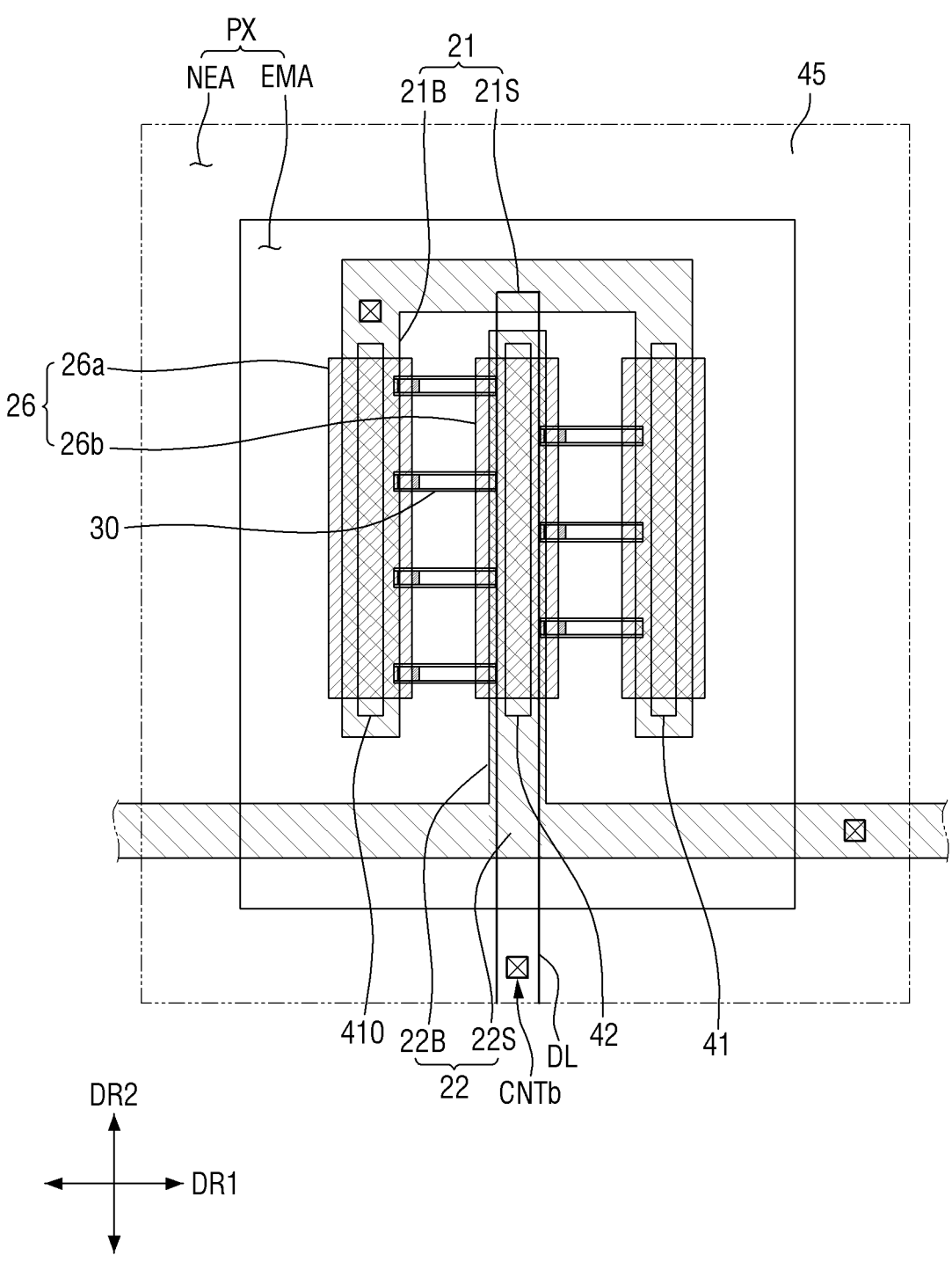
FIG. 22 is an enlarged schematic plan view of a pixel of the display device according to yet another embodiment.
Figure 23:
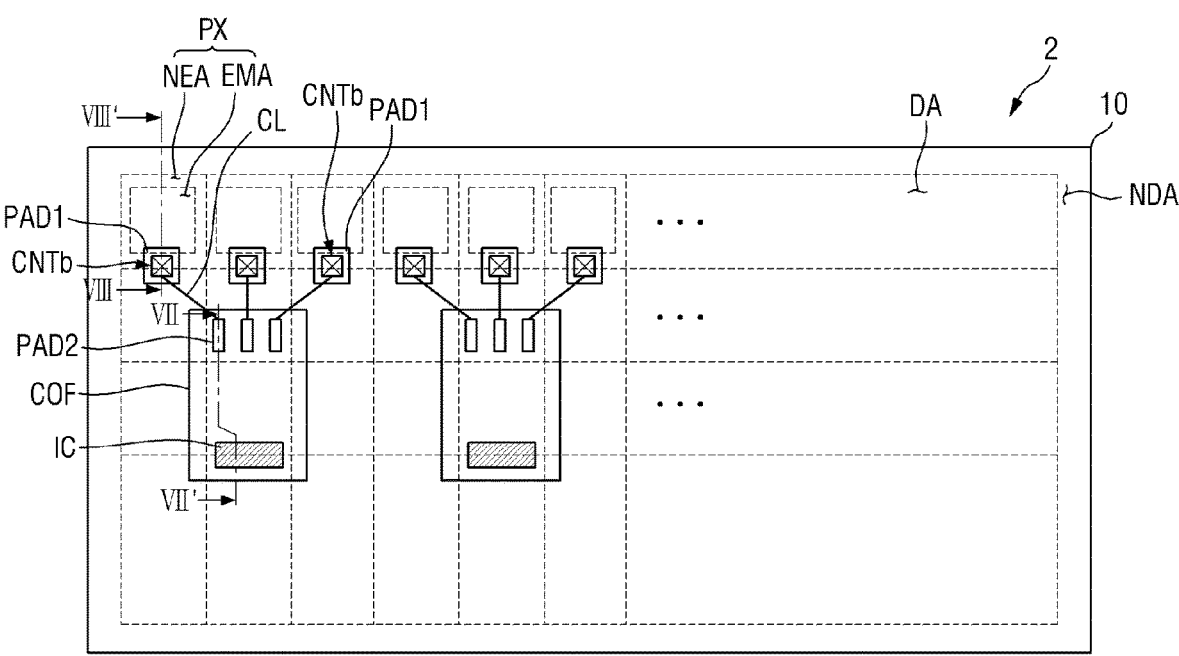
FIG. 23 is a schematic plan view of the display device viewed from below according to yet another embodiment.
Figure 23:
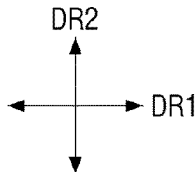
Figure 24:
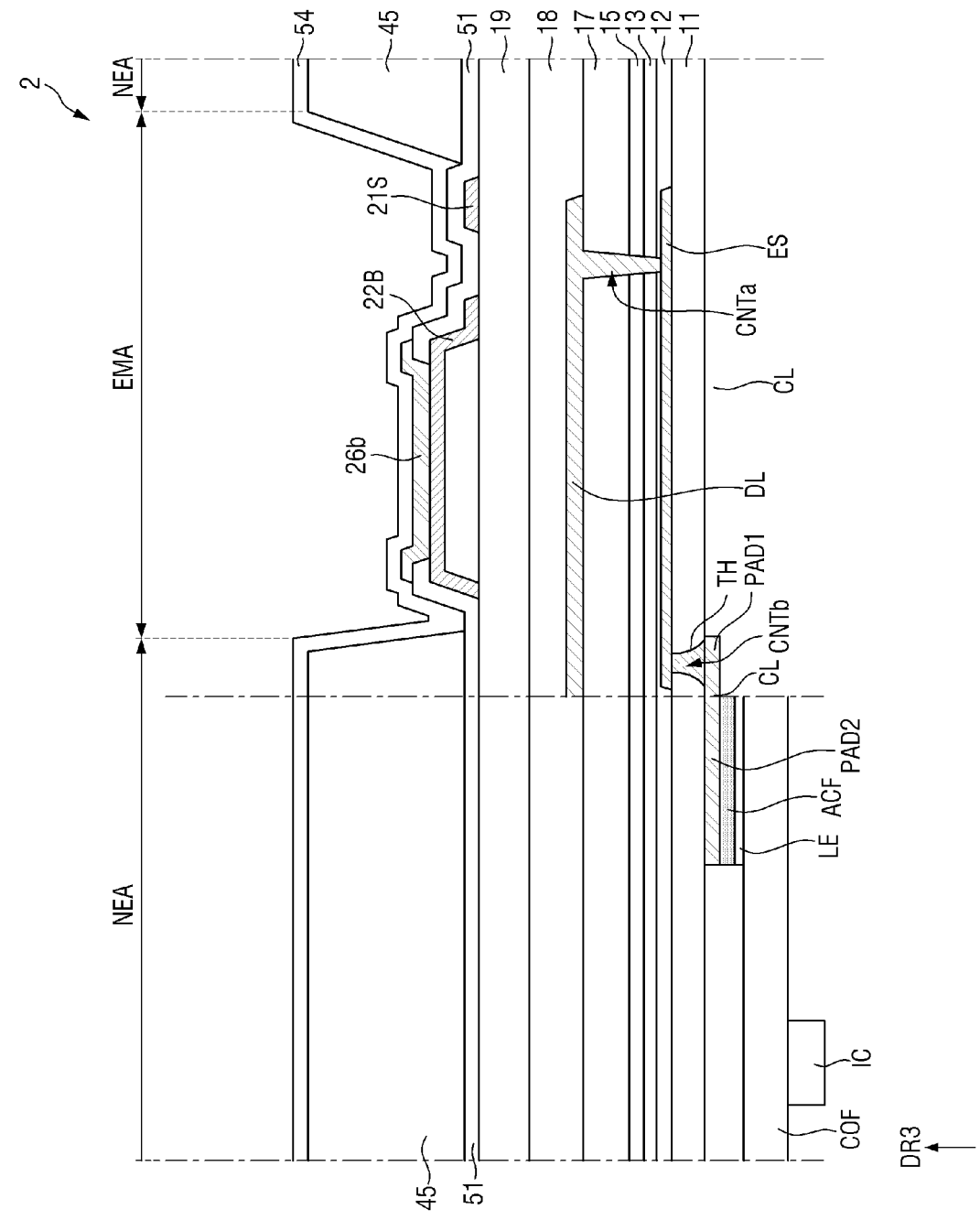
FIG. 24 is a schematic cross-sectional view of the display device according to FIGS. 23 and 25.

FIG. 21 is a schematic plan view of a display device viewed from above according to yet another embodiment. FIG. 22 is an enlarged schematic plan view of a pixel of the display device according to yet another embodiment. FIG. 23 is a schematic plan view of the display device viewed from below according to yet another embodiment. FIG. 24 is a schematic cross-sectional view of the display device according to FIGS. 21 and 23.

Referring to FIGS. 21 to 24, a display device 2 according to an embodiment may be different from the display device 1 according to FIGS. 3, 4, 6, and 7 at least in that a substrate connection electrode CNTb may be disposed to overlap a non-emission area NEA of a pixel PX in a display area DA.

More specifically, in the display device 2 according to an embodiment, the substrate connection electrode CNTb may be disposed to overlap the non-emission area NEA of the pixel PX in the display area DA.

The substrate connection electrode CNTb may be disposed to overlap an external bank 45 in a thickness direction thereof. A first pad PAD1 connected to the substrate connection electrode CNTb may be disposed to overlap the non-emission area NEA like the substrate connection electrode CNTb.

According to an embodiment, since the substrate connection electrode CNTb may be formed only in a first substrate 11, any interference to an upper structure of the first substrate 11 may not occur. Accordingly, in case that the substrate connection electrode CNTb is formed, irrespective of an emission area EMA or the non-emission area NEA, there may be no restriction on a formation area.

Figure 25:
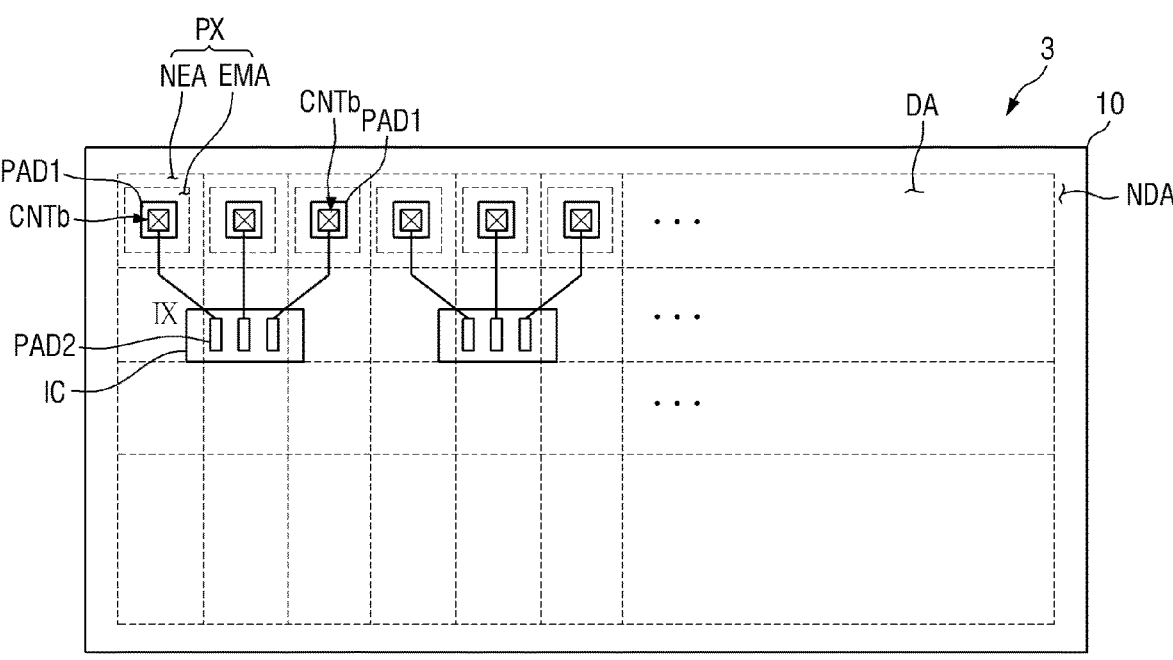
FIG. 25 is a schematic plan view of a display device viewed from below according to yet another embodiment.
Figure 25:
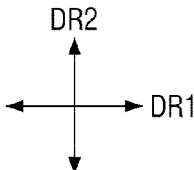
Figure 26:
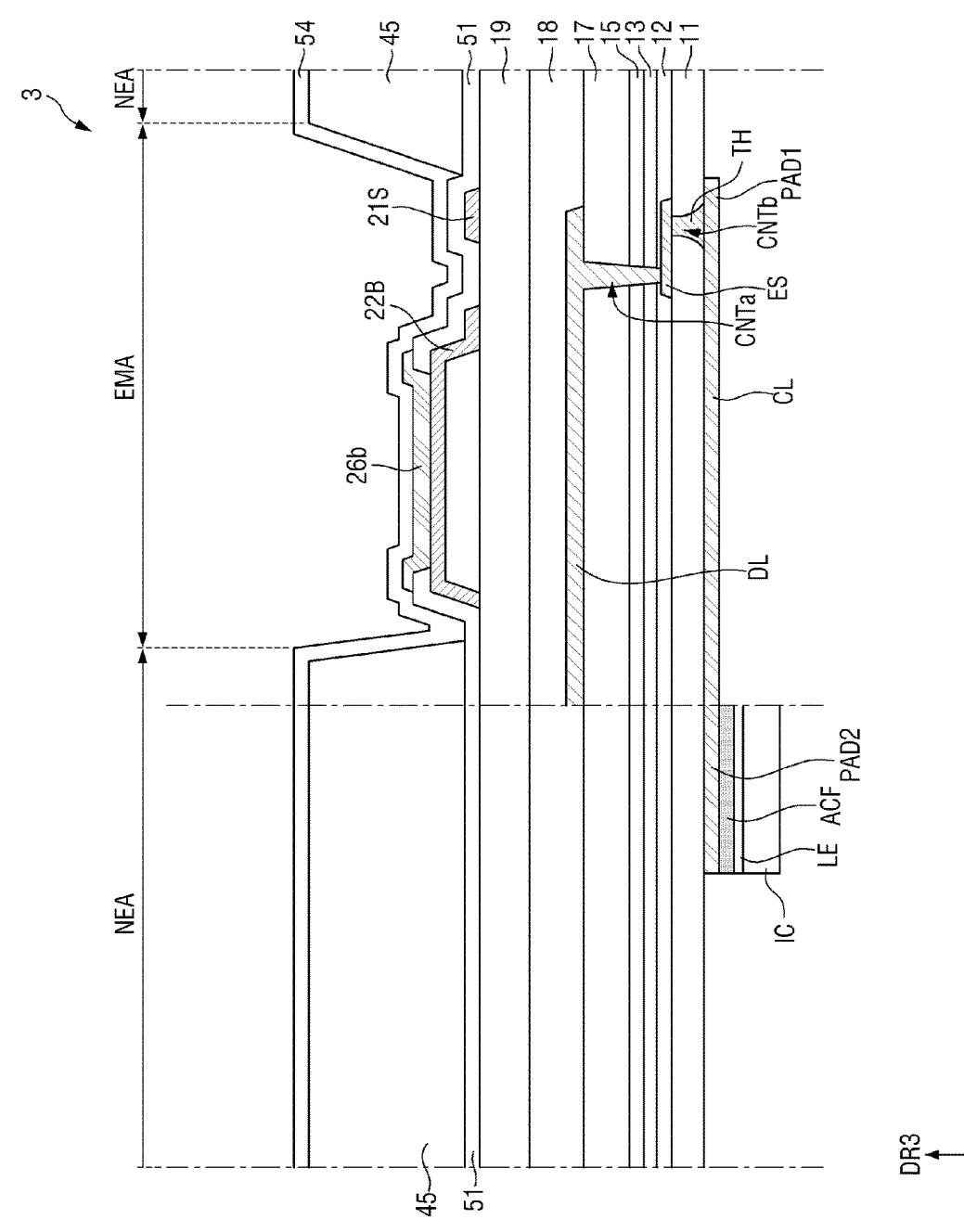
FIG. 26 is a schematic cross-sectional view of the display device according to FIG. 25.

FIG. 25 is a schematic plan view of a display device viewed from below according to yet another embodiment. FIG. 26 is a schematic cross-sectional view of the display device according to FIG. 25.

Referring to FIGS. 25 and 26, a display device 3 according to an embodiment may be different from the display device 1 according to FIGS. 6 and 7 at least in that a driving chip IC of the display device 3 may be disposed to overlap second pads PAD2 and connected to the second pads PAD2.

More specifically, the driving chip IC of the display device 3 according to an embodiment may be disposed to the overlap the second pads PAD2 and may be connected to the second pads PAD2. The display device 3 according to an embodiment may be different from the display device 1 according to FIGS. 6 and 7 at least in that the chip-on-chip COF according to FIGS. 6 and 7 may be omitted.

According to an embodiment, since the chip-on-film COF (see FIGS. 6 and 7) may be omitted and the driving chip IC may be attached directly onto and connected to the second pads PAD2, the structure of the display device 3 can be simplified.

Figure 27:
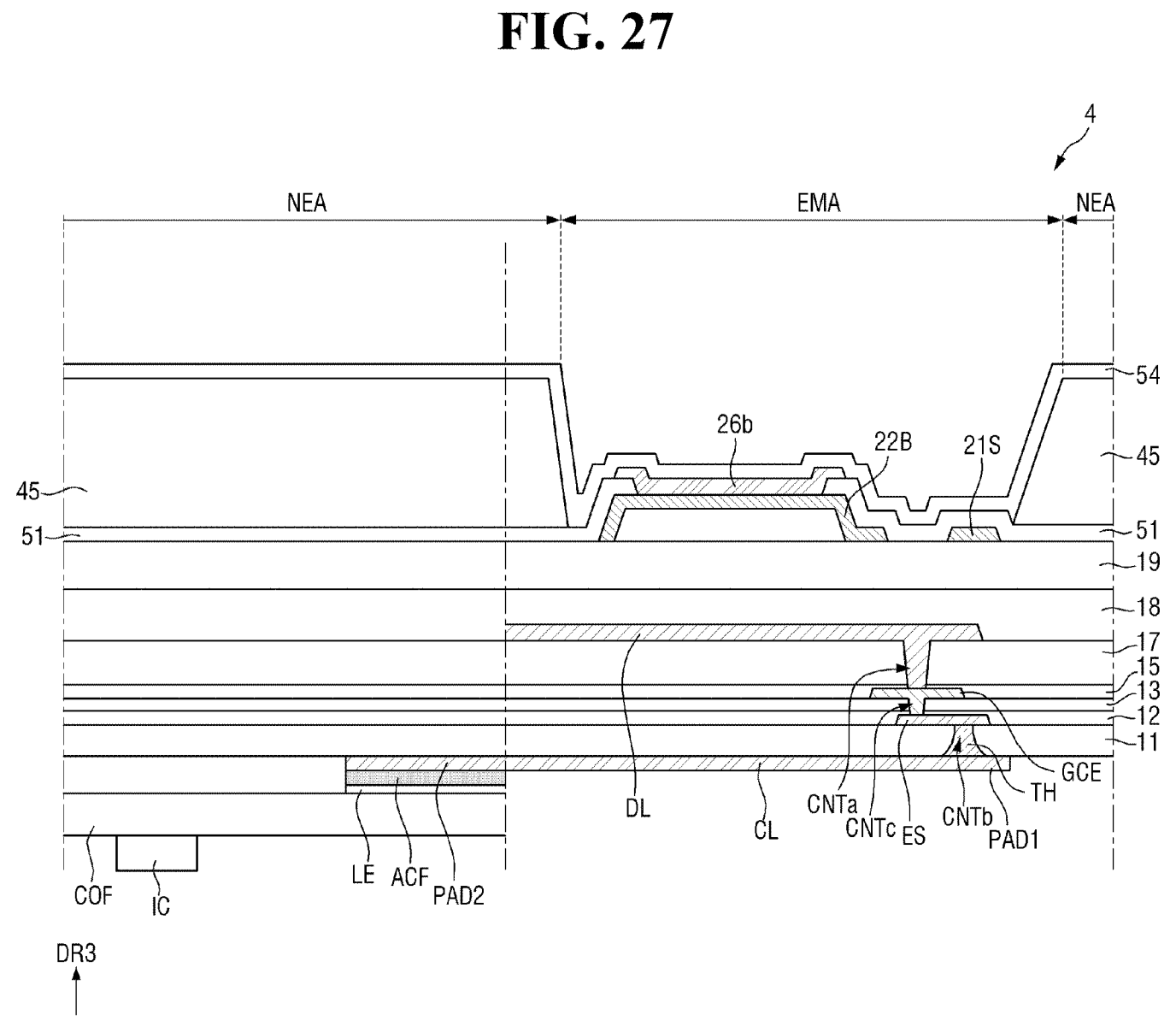

FIG. 27 is a schematic cross-sectional view of a display device according to yet another embodiment.

Referring to FIG. 27, a display device 4 according to an embodiment may be different from the display device 1 according to FIG. 7 at least in that the display device 4 further may include a gate connection electrode GCE connected to a data line DL and a gate connection electrode CNTc connecting the gate connection electrode GCE and an etching stopper ES.

More specifically, the display device 4 may further include the gate connection electrode GCE connected to the data line DL and the gate connection electrode CNTc connecting the gate connection electrode GCE and the etching stopper ES.

The gate connection electrode GCE may be disposed on the first gate conductive layer described above with reference to FIG. 7. The gate connection electrode CNTc may pass through a first gate insulating layer 13 and a buffer layer 12 in a thickness direction thereof.

In some embodiments, the gate connection electrode GCE may also be disposed on a second gate conductive layer. The gate connection electrode CNTc may pass through a first protective layer 15, the first gate insulating layer 13, and the buffer layer 12 in the thickness direction.

According to an embodiment, since the gate connection electrode GCE and the gate connection electrode CNTc may be further formed, the overall resistance of a current path from the data line DL to a first pad PAD1 can be lowered.

Figure 28:
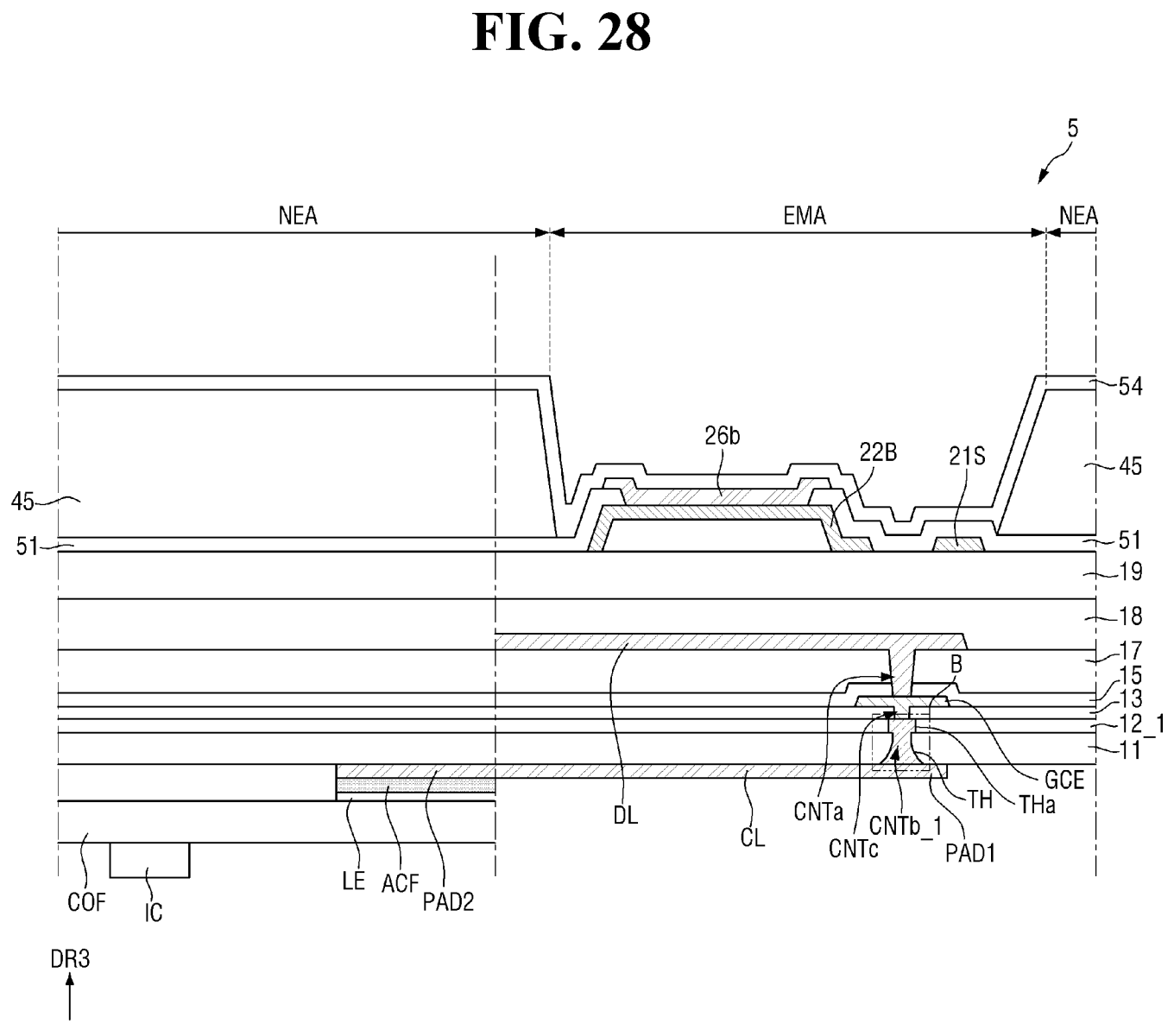
Figure 29:
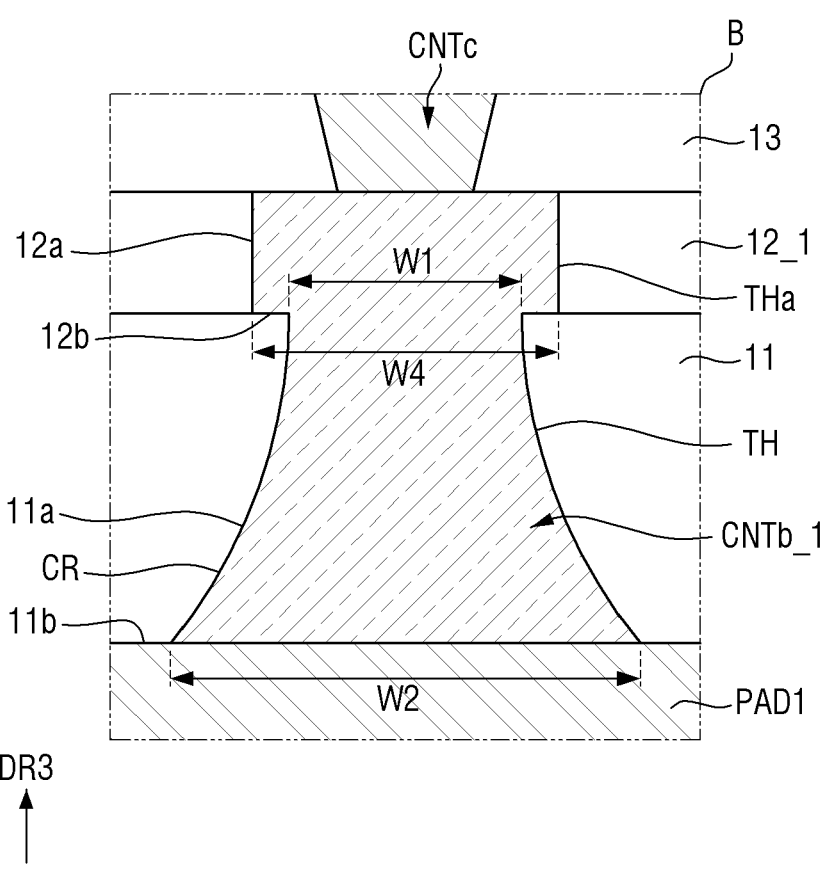
FIG. 29 is an enlarged schematic cross-sectional view of area B of FIG. 28.

FIG. 28 is a schematic cross-sectional view of a display device according to yet another embodiment. FIG. 29 is an enlarged schematic cross-sectional view of area B of FIG. 28.

Referring to FIGS. 28 and 29, a display device 5 according to an embodiment may be different from the display device 1 according to an embodiment at least in that a buffer layer 12_1 may serve as the etching stopper ES in the display device 1 according to an embodiment.

More specifically, in the display device 5 according to an embodiment, the buffer layer 12_1 may serve as the etching stopper ES in the display device 1 according to an embodiment.

The buffer layer 12_1 according to an embodiment may include a buffer through-hole THa overlapping a substrate through-hole TH. A substrate connection electrode CNTb_1 described above in FIG. 7 may fill the substrate through-hole TH and the buffer through-hole THa. The substrate connection electrode CNTb_1 may be connected to a data line DL through the gate connection electrode CNTc and gate connection electrode GCE described above with reference to FIG. 27, and a data connection electrode CNTa. In some embodiments, the gate connection electrode CNTc and the gate connection electrode GCE may be omitted. The data connection electrode CNTa may pass through a first interlayer insulating layer 17, a first protective layer 15, and a first gate insulating layer 13, and the data connection electrode CNTa may be connected directly to the substrate connection electrode CNTc.

The buffer layer 12_1 may include a surface 12b in contact with a surface of a first substrate 11 and another surface opposite to the surface 12b of the buffer layer 12_1. Another surface of the buffer layer 12_1 may be in direct contact with a surface 13a of the first gate insulating layer 13. The buffer through-hole THa may be surrounded by an extension of a surface 12b of the buffer layer 12_1, an extension of another surface of the buffer layer 12, and side surfaces 12a of the buffer layer 12.

An average slope of the side surface 12a of the buffer layer 12_1 may be greater than an average slope of a side surface 11a of the first substrate 11.

In the buffer through-hole THa, a width W4 of the extension of the surface 12b of the buffer layer 12_1 or an upper width of the buffer through-hole THa may be the same as a width W4 of the extension of another surface of the buffer layer 12 or a lower width of the buffer through-hole THa.

The width W4 of the extension of the surface 12b of the buffer layer 12_1 may be greater than a width W1 of the substrate through-hole TH. For example, the buffer through-hole THa may be disposed to overlap the substrate through-hole TH in a thickness direction thereof and may be disposed to partially overlap a surface of the first substrate 11.

According to an embodiment, in case that the substrate through-hole TH is formed, laser irradiation and etching are performed together, thereby securing processing quality, a processing speed, and a high aspect ratio (thickness-to-width ratio of the substrate through-hole TH) of the substrate through-hole TH.

Furthermore, the buffer layer 12_1 may be used as the etching stopper, thereby preventing an etching solution from being diffused into a surface of the first substrate in case that the substrate through-hole TH may be formed. Thus, it may be possible to prevent corrosion and/or etching of electrodes on the first substrate due to the etching solution.

Furthermore, the existing buffer layer 12_1 on the first substrate may be used as the etching stopper without any change, thereby simplifying a manufacturing process without the addition of separate members and/or components.

Since the substrate connection electrode CNTb may be disposed in a display area DA, a chip-on-film COF connected to the substrate connection electrode CNTb may be formed on another surface of the first substrate 11 of the display device 5 and may be disposed in the display area DA. Thus, it may be possible to reduce a dead space due to the arrangement of the chip-on-film COF and a fan-out line.

FIGS. 30 to 33 are schematic cross-sectional views of process operations of a method of manufacturing a display device according to another embodiment.

Figure 30:
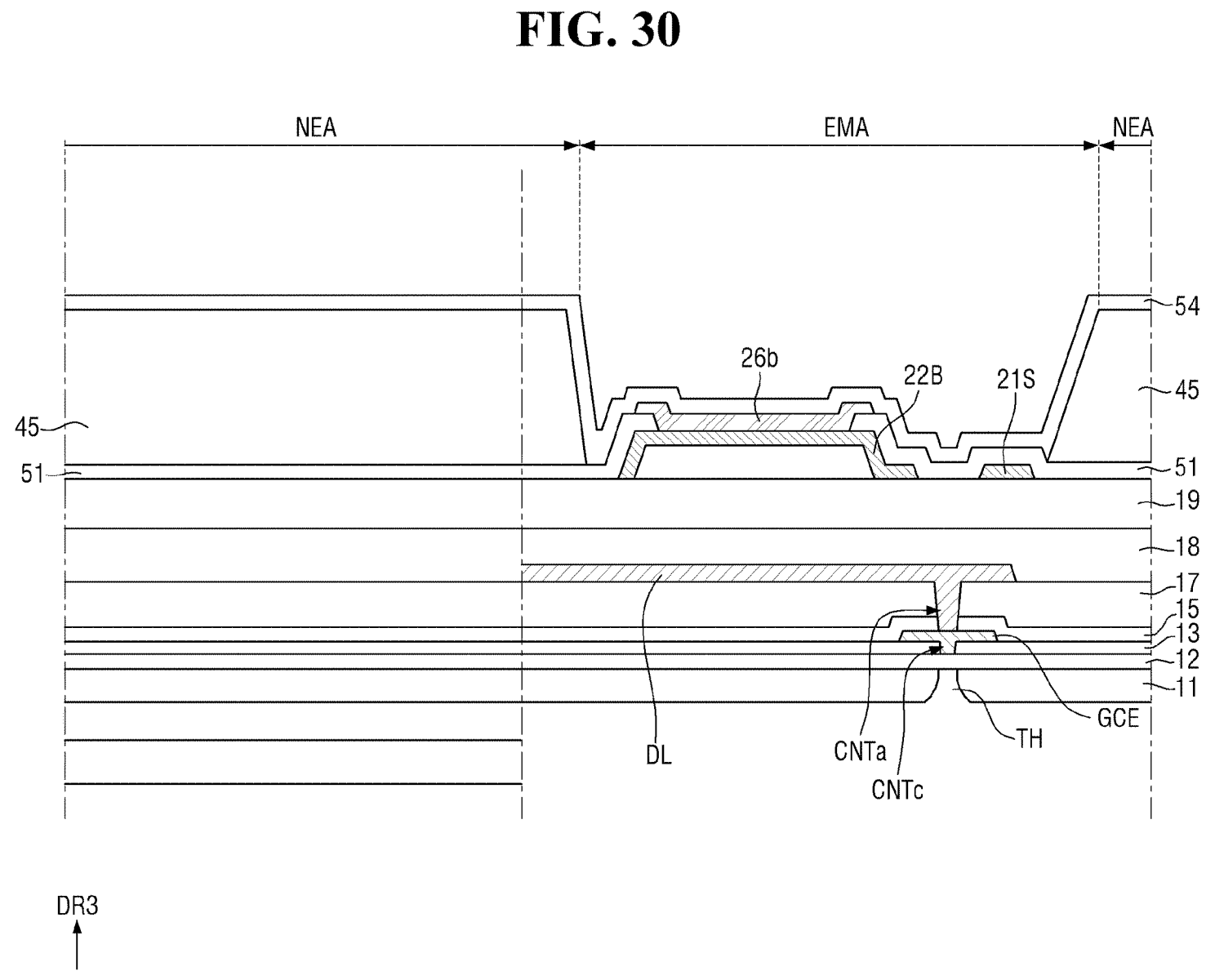

First, referring to FIG. 30, a substrate through-hole TH may be formed using a buffer layer 12 as an etching stopper. Since the formation of the substrate through-hole TH has been described above with reference to FIGS. 10 and 11, redundant descriptions will be omitted.

Subsequently, referring to FIG. 31, a buffer through-hole THa may be formed. Dry etching may be used to form the buffer through-hole THa. Since the buffer through-hole THa may be formed through the dry etching and the substrate through-hole TH may be formed through wet etching, an average slope of a side surface 12a of a buffer layer 12_1 may be greater than an average slope of a side surface 11a of a first substrate 11.

Figure 31:
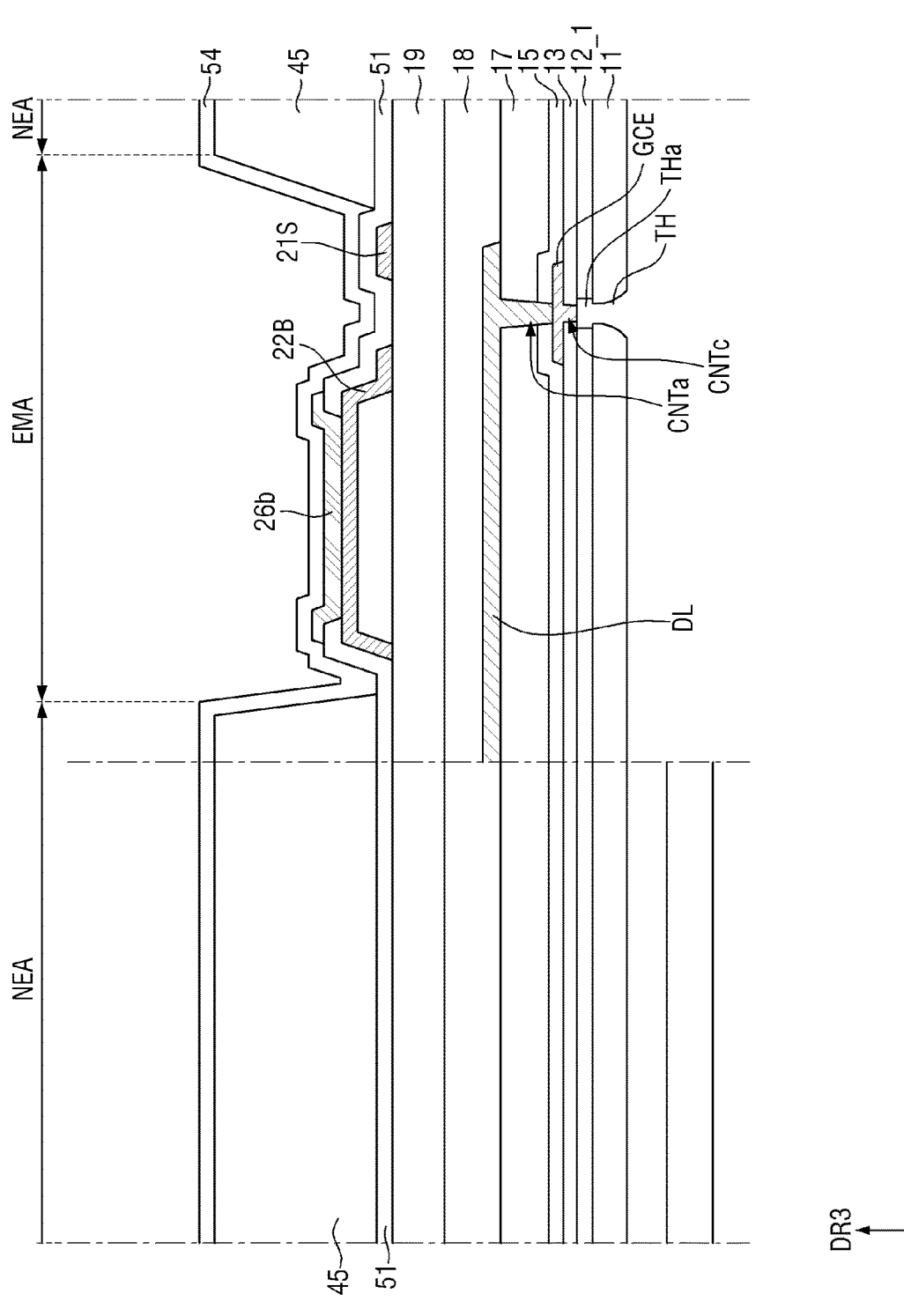

In the case of over etching, as shown in FIG. 31, a surface of the first substrate 11 may be partially exposed by the buffer layer 12_1. For example, the buffer through-hole THa may be disposed to overlap the substrate through-hole TH in a thickness direction thereof and may be disposed to partially overlap a surface of the first substrate 11.

Figure 32:

Referring to FIG. 32, the substrate through-hole TH and the buffer through-hole THa may be filled with a substrate connection electrode CNTb_1. The substrate connection electrode CNTb_1 may be connected to a data line DL through the gate connection electrode CNTc and gate connection electrode GCE described above with reference to FIG. 27, and a data connection electrode CNTa.

Figure 33:
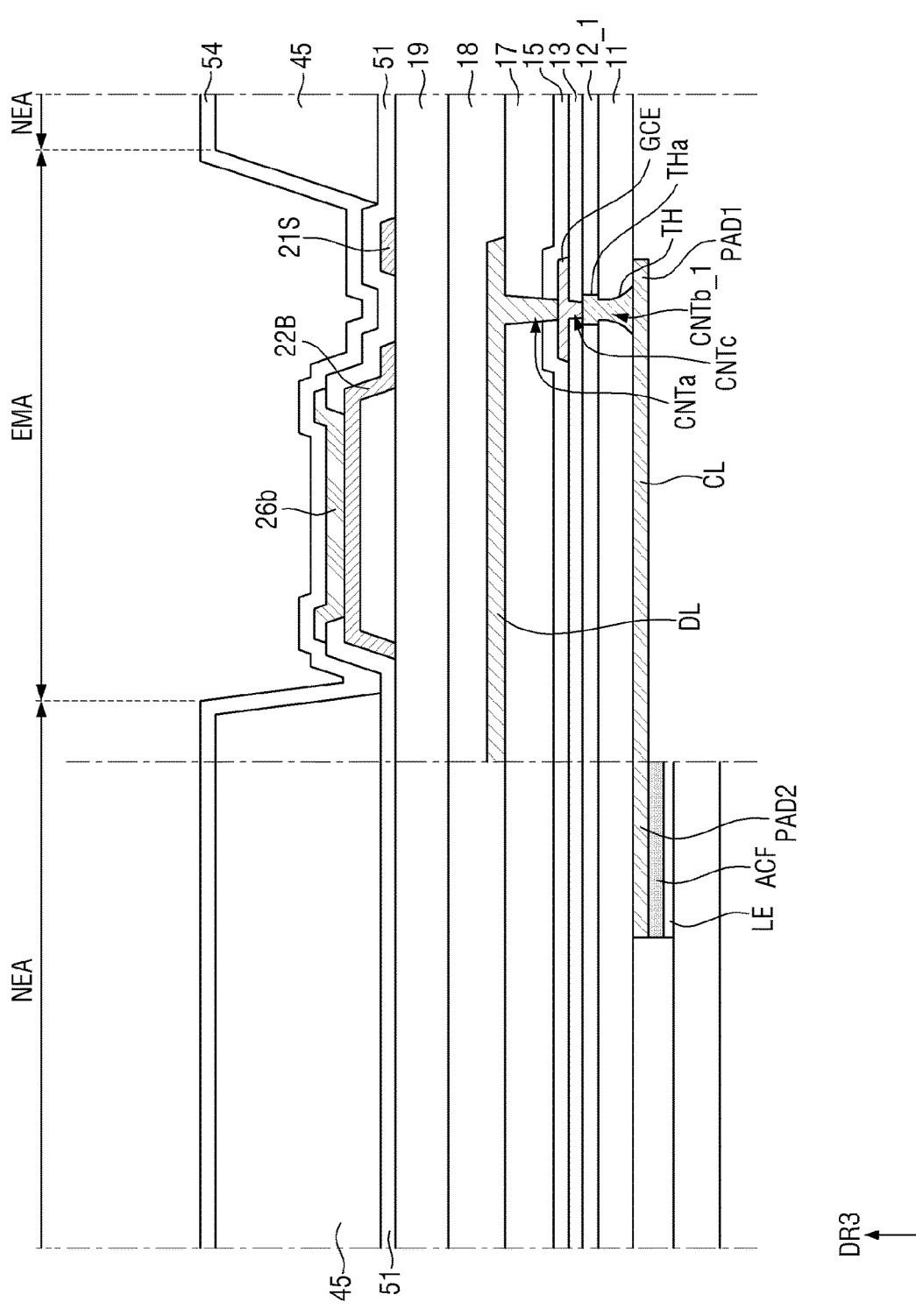

Subsequently, referring to FIG. 33, a first pad PAD1, a connection line CL, and a second pad PAD2 may be formed.

The first pad PAD1, the connection line CL, and the second pad PAD2 may each be disposed on another surface (or a rear surface) of the first substrate 11. An end portion of the connection line CL may be connected to the first pad PAD1, and another end portion of the connection line CL may be connected to the second pad PAD2. The first pad PAD1 may be disposed to overlap the substrate connection electrode CNTb_1 in a thickness direction thereof and may be in direct contact with the substrate connection electrode CNTb_1. The first pad PAD1 may be electrically connected to the substrate connection electrode CNTb_1. The connection line CL, the first pad PAD1, and the second pad PAD2 may be disposed to be coplanar with each other and may include the same material. However, the disclosure is not limited thereto, and the connection line CL, the first pad PAD1, and the second pad PAD2 may include different materials. The connection line CL may include a conductive material. For example, the connection line CL may include at least one selected from among molybdenum (Mo), aluminum (Al), chromium (Cr), gold (Au), titanium (Ti), nickel (Ni), neodymium (Nd), and copper (Cu), or an alloy thereof. The connection line CL may be formed as a single layer made of the above-described material. In some embodiments, the connection line CL may be formed as a multilayer made of the above-described material.

A chip-on-film COF may be disposed on the second pad PAD2 through an anisotropic conductive film ACF. A lead line LE of the chip-on-film COF may be electrically connected to the second pad PAD2 through the anisotropic conductive film ACF.

Figure 34:
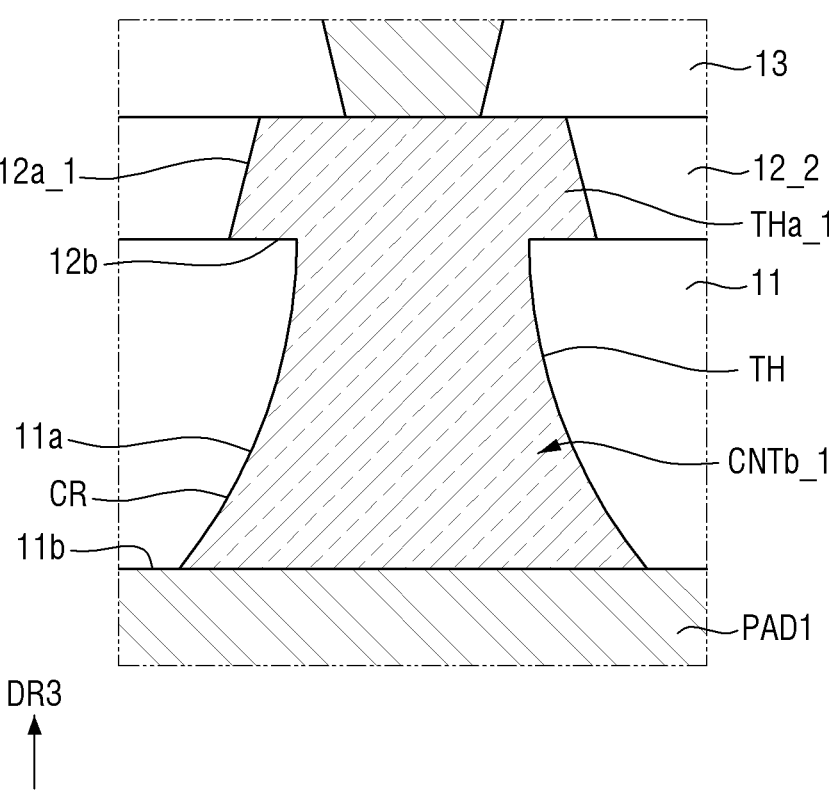
FIG. 34 is a schematic cross-sectional view of a display device according to yet another embodiment.

FIG. 34 is a schematic cross-sectional view of a display device according to yet another embodiment.

Referring to FIG. 34, a buffer layer 12_2 and a buffer through-hole THa_1 according to an embodiment may be different from the buffer layer 12 and the buffer through-hole THa according to FIG. 29 at least in that, in the buffer through-hole THa_1 of the buffer layer 12_2, a width of the buffer through-hole THa_1 gradually decreases in a direction from an extension of a surface 12b of the buffer layer 12_2 toward an extension of another surface of the buffer layer 12_2.

More specifically, in the buffer through-hole THa_1 of the buffer layer 12_2 according to an embodiment, the width of the buffer through-hole THa_1 may gradually decrease in the direction from the extension of a surface 12b of the buffer layer 12_2 toward the extension of another surface of the buffer layer 12_2.

According to an embodiment, an inclined cross-sectional shape of a side surface 12a_1 of the buffer layer 12_2 in contact with the buffer through-hole THa_1 may be a linear shape that may be inclined with respect to a third direction DR3. For example, an inclination angle of the side surface 12a_1 of the buffer layer 12_2 may be constant.

Figure 35:
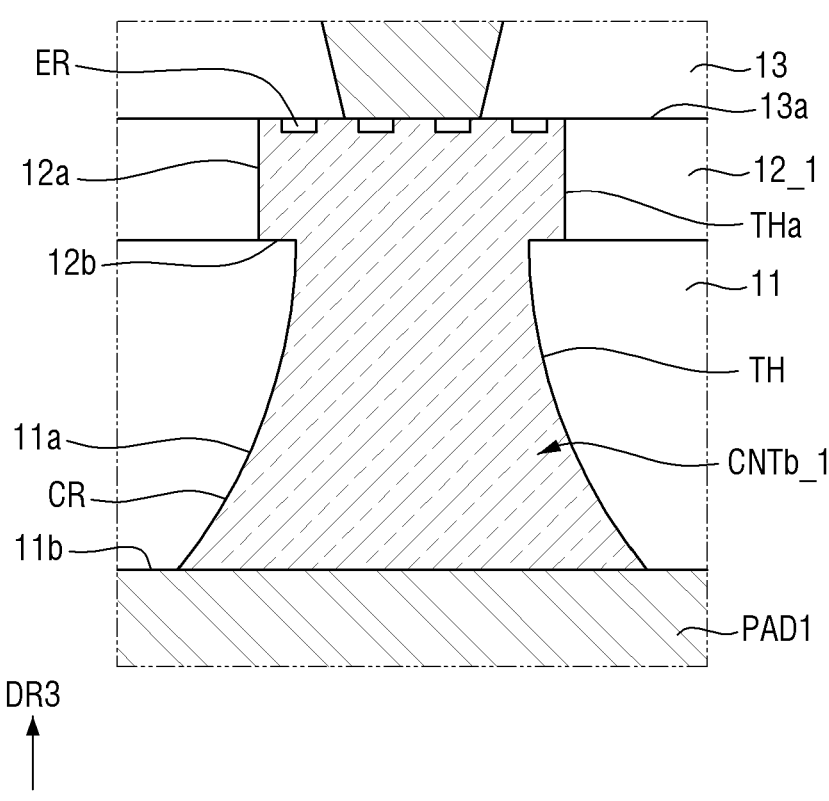
FIG. 35 is a schematic cross-sectional view of a display device according to yet another embodiment.

FIG. 35 is a schematic cross-sectional view of a display device according to yet another embodiment.

Referring to FIG. 35, an embodiment may be different from an embodiment of FIG. 29 in that an etching residue ER may remain on a surface 13a of a first gate insulating layer 13.

More specifically, the etching residue ER may remain on a surface 13a of the first gate insulating layer 13 in a buffer through-hole THa.

In an embodiment, after the buffer through-hole THa may be formed, in case that a buffer layer residue remains on a surface 13a of the first gate insulating layer 13 and may not be completely removed, the etching residue ER may be formed. The buffer layer residue, that is, the etching residue ER, may include the same material as a buffer layer 12_1. The etching residue ER may be in direct contact with a substrate connection electrode CNTb in the buffer through-hole THa.

Figure 36:
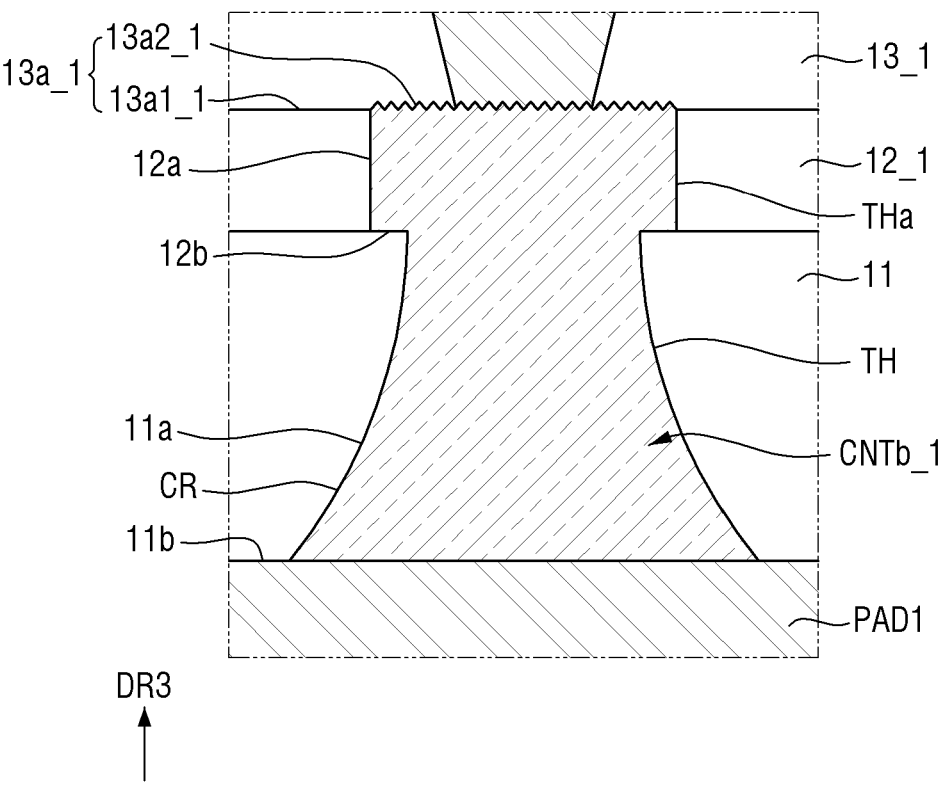
FIG. 36 is a schematic cross-sectional view of a display device according to yet another embodiment.

FIG. 36 is a schematic cross-sectional view of a display device according to yet another embodiment.

Referring to FIG. 36, a first gate insulating layer 13_1 according to an embodiment may be different from the first gate insulating layer 13 according to FIG. 29 at least in that a surface 13a_1 of the first gate insulating layer 13_1 may include a first portion 13a1_1 and a second portion 13a2_1.

More specifically, a surface 13a_1 of the first gate insulating layer 13_1 according to an embodiment may include the first portion 13a1_1 and the second portion 13a2_1. A surface roughness of the first portion 13a1_1 may be lower than a surface roughness of the second portion 13a2_1. The first portion 13a1_1 may be a portion not in contact with a substrate connection electrode CNTb, and the second portion 13a2_1 may be a portion in contact with the substrate connection electrode CNTb. A surface of the first gate insulating layer 13_1, at which a buffer layer 12_1 may be exposed, may be partially etched by a dry etching solution in an etching operation to form the he second portion 13a2_1.

Since other descriptions have been made above with reference to FIG. 29, redundant descriptions will be omitted.

Figure 37:
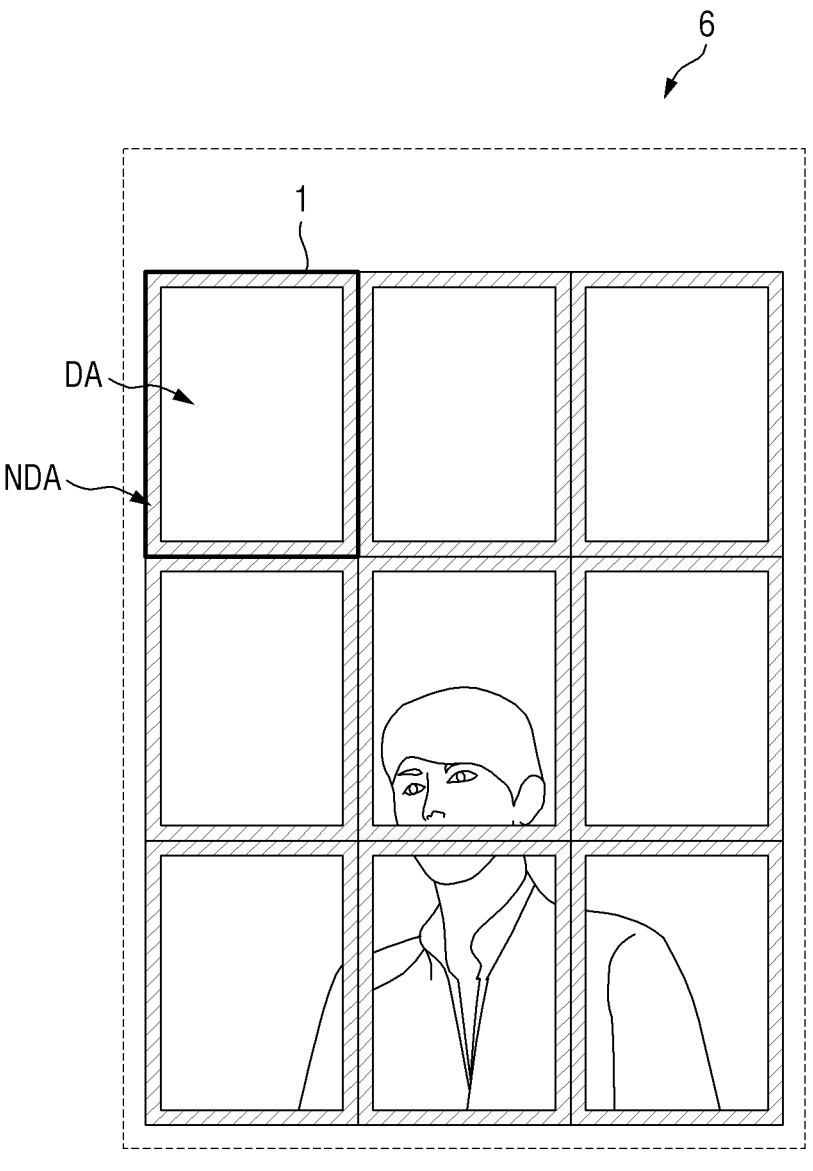
FIG. 37 is a schematic plan view of a display device according to yet another embodiment.

FIG. 37 is a schematic plan view of a display device according to yet another embodiment.

Referring to FIG. 37, a display device 6 according to an embodiment may be different from the display device 1 according to an embodiment at least in that a tile type display device may be applied and the display device 6 includes multiple display devices 1.

Since the display devices 1 included in the display device 6 have been described above, detailed descriptions thereof will be omitted.

The display devices 1 may be disposed by connecting long sides or short sides thereof to each other. Some display devices 1 may form a side of the display device 6, some display devices 1 may be positioned at an edge of the display device 6 to constitute two adjacent sides of the display device 6, and some display devices 1 may be positioned inside the display device 6 to have a structure surrounded by other display devices 1. The display devices 1 may have different bezel shapes according to positions thereof and may also have the same bezel shape.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

what is claimed is:

1. A display device comprising:
a base substrate in which a display area and a non-display area positioned around the display area are defined and which includes a substrate connection electrode passing through the base substrate in a thickness direction thereof;
an etching stopper disposed on a first surface of the base substrate and that covers the substrate connection electrode;
a first pad disposed on a second surface opposite to the first surface of the base substrate and disposed to overlap a substrate through-hole;
a buffer layer disposed on the etching stopper;
an active material layer disposed on the buffer layer; and
a light blocking layer disposed to overlap the active material layer, wherein
the substrate connection electrode is disposed in the display area and electrically connected to the etching stopper and the first pad,
the etching stopper is electrically connected to the first pad through the substrate connection electrode and includes a conductive material, and
the light blocking layer is disposed to be coplanar with the etching stopper and spaced apart from the etching stopper.

2. The display device of claim 1, further comprising:
a first gate insulating layer disposed on the active material layer;
a data line disposed on the first gate insulating layer, wherein the data line is electrically connected to the etching stopper through a data connection electrode passing through the first gate insulating layer and the buffer layer in a thickness direction thereof; and
a connection line disposed on the second surface of the base substrate, wherein the connection line is electrically connected to the first pad.

3. The display device of claim 2, further comprising:
a chip-on-film which is disposed on the second surface of the base substrate and on which a driving chip is mounted; and
a second pad disposed on the second surface of the base substrate, wherein
the second pad is electrically connected to the connection line, and
the chip-on-film is electrically connected to the second pad.

4. The display device of claim 2, further comprising:
a driving chip disposed on the second surface of the base substrate; and
a second pad disposed on the second surface of the base substrate, wherein
the second pad is electrically connected to the connection line, and
the driving chip is disposed to overlap the second pad and electrically connected to the second pad.

5. The display device of claim 2, wherein
the first surface of the base substrate is in contact with the etching stopper, and
the substrate connection electrode is surrounded by an extension of the second surface of the base substrate, an extension of the first surface of the base substrate, and side surfaces of the base substrate.

6. The display device of claim 5, wherein a width of the substrate connection electrode decreases in a direction from the extension of the second surface of the base substrate toward the extension of the first surface of the base substrate.

7. The display device of claim 6, wherein a slope of a side surface of the substrate connection electrode in contact with the side surface of the base substrate gradually increases in a direction from the extension of the second surface of the base substrate toward the extension of the first surface of the base substrate.

8. The display device of claim 5, wherein a width of the substrate connection electrode is constant from the extension of the second surface of the base substrate to the extension of the first surface of the base substrate.

9. The display device of claim 5, wherein a roughness of a portion of one surface of the etching stopper in contact with the substrate connection electrode is higher than a roughness of a portion of the one surface of the etching stopper that is not in contact with the substrate connection electrode.

10. The display device of claim 5, wherein an etching residue is further disposed on a surface of the etching stopper in contact with the substrate connection electrode, and the etching residue includes the same material as the base substrate.

11. The display device of claim 2, wherein the display area includes a plurality of pixels, each of the pixels includes an emission area and a non-emission area positioned around the emission area, an external bank disposed on the data line is disposed in the non-emission area, a light-emitting element is disposed in the emission area, and the emission area is surrounded by the external bank in a plan view.

12. The display device of claim 11, wherein the substrate connection electrode is disposed to overlap the emission area.

13. The display device of claim 11, wherein the substrate connection electrode is disposed to overlap the external bank of the non-emission area.

14. The display device of claim 1, further comprising:

a first gate insulating layer disposed on the active material layer;

a gate connection electrode disposed on the first gate insulating layer;

a first protective layer disposed on the gate connection electrode; and a data line disposed on the first protective layer, wherein the data line is electrically connected to the gate connection electrode through a data connection electrode passing through the first protective layer, and the gate connection electrode is electrically connected to the etching stopper through a gate connection electrode passing through the first gate insulating layer and the buffer layer.

15. A display device comprising:

a base substrate in which a display area and a non-display area positioned around the display area are defined and which includes a substrate through-hole passing through the base substrate in a thickness direction thereof;

a buffer layer which is a buffer layer disposed on a first surface of the base substrate and includes a buffer through-hole disposed to overlap the substrate through-hole and passing through the buffer layer in a thickness direction thereof;

a data line disposed on the buffer layer;

a substrate connection electrode that fills the substrate through-hole and the buffer through-hole, wherein the substrate connection electrode is disposed in the display area and electrically connected to the data line; and a first pad disposed on a second surface opposite to the first surface of the base substrate and disposed to overlap the substrate through-hole, wherein the first pad is electrically connected to the substrate through-hole.

16. The display device of claim 15, wherein the first surface of the base substrate is in contact with the buffer layer, the substrate through-hole is surrounded by an extension of the second surface of the base substrate, an extension of the first surface of the base substrate, and side surfaces of the base substrate, the buffer layer includes a first surface in contact with the first surface of the base substrate and a second surface opposite to the first surface of the buffer layer, the buffer through-hole is surrounded by an extension of the first surface of the buffer layer, an extension on the second surface of the buffer layer, and side surfaces of the buffer layer, and an average slope of the side surface of the buffer layer is greater than an average slope of the side surface of the base substrate.

17. The display device of claim 16, further comprising a first gate insulating layer disposed directly on the second surface of the buffer layer, wherein a roughness of a surface of the first gate insulating layer in contact with the substrate connection electrode is higher than a roughness of a surface of the first gate insulating layer that is not in contact with the substrate connection electrode.

18. The display device of claim 16, further comprising a first gate insulating layer disposed directly on the second surface of the buffer layer, wherein an etching residue is further disposed on a surface of the first gate insulating layer in contact with the substrate connection electrode and includes a same material as a material of the buffer layer.

19. The display device of claim 16, wherein the buffer through-hole is disposed to partially overlap a surface of the base substrate in a thickness direction thereof.

* * * * *